(12) United States Patent
Fukuzumi et al.

(10) Patent No.: US 6,403,444 B2
(45) Date of Patent: Jun. 11, 2002

(54) METHOD FOR FORMING STORAGE CAPACITOR HAVING UNDULATED LOWER ELECTRODE FOR A SEMICONDUCTOR DEVICE

(75) Inventors: Yoshiaki Fukuzumi, Yokohama; Yusuke Kohyama, Yokosuka, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/800,915

(22) Filed: Mar. 8, 2001

Related U.S. Application Data

(62) Division of application No. 09/283,280, filed on Apr. 1, 1999, now Pat. No. 6,222,722.

(30) Foreign Application Priority Data

Apr. 2, 1998 (JP) .............................................. 10-089822

(51) Int. Cl.[7] .............................................. H01L 21/20
(52) U.S. Cl. ...................................... 438/396; 438/255
(58) Field of Search ................................ 438/253, 254, 438/255, 396, 397, 398

(56) References Cited

U.S. PATENT DOCUMENTS

| | | | |
|---|---|---|---|
| 5,290,729 A | | 3/1994 | Haysahide et al. .......... 438/255 |
| 5,318,920 A | | 6/1994 | Hayashide et al. .......... 438/398 |
| 5,556,802 A | * | 9/1996 | Bakerman, Jr. et al. |
| 5,700,710 A | * | 12/1997 | Zenke |
| 5,937,294 A | * | 8/1999 | Sandhu et al. .............. 438/255 |
| 5,952,687 A | | 9/1999 | Kawakubo et al. ......... 257/296 |
| 5,960,294 A | * | 9/1999 | Zahurak et al. ............. 438/398 |
| 6,011,286 A | | 1/2000 | Wu ............................ 257/309 |
| 6,103,571 A | * | 8/2000 | Li et al. ..................... 438/255 |

FOREIGN PATENT DOCUMENTS

| | | |
|---|---|---|
| JP | 6-163853 | 6/1994 |
| JP | 9-36322 | 2/1997 |

* cited by examiner

*Primary Examiner*—Tuan H. Nguyen
(74) *Attorney, Agent, or Firm*—Banner & Witcoff, Ltd.

(57) ABSTRACT

This invention provides a capacitor including a metal lower electrode having an undulated shape and an improved electrode area, and a method of manufacturing the same. A capacitor for data storage is formed on a semiconductor substrate (not shown) via an insulating interlayer having a contact plug. The capacitor has a lower electrode whose inner and outer surfaces are rough or undulated such that one surface has a shape conforming to the shape of the other surface, a dielectric film formed to cover the surfaces of the lower electrode, and an upper electrode formed to cover the lower electrode via the dielectric film. The lower electrode has a cylindrical shape with an open upper end. The lower electrode is connected to a cell transistor through the contact plug. The lower electrode is formed from a metal or a metal oxide.

38 Claims, 15 Drawing Sheets

METHOD FOR FORMING STORAGE CAPACITOR HAVING UNDULATED LOWER ELECTRODE FOR A SEMICONDUCTOR DEVICE

This application is a Divisional of U.S. application Ser. No. 09/283,280 filed on Apr. 1, 1999, now U.S. Pat. No. 6,222,722.

BACKGROUND OF THE INVENTION

The present invention relates to a high-density semiconductor memory device having a stacked capacitor structure and a method of manufacturing the same, and more particularly, to a data storage capacitor having an improved charge storage electrode and a method of manufacturing the same.

In the field of DRAMs (Dynamic RAMs) having capacitors for holding data, various kinds of techniques have been developed to ensure a given data storage charge amount to deal with the decrease of the cell area resulting from miniaturization. An example is disclosed in H. Watanabe et al., "An Advanced Fabrication Technology of Hemispherical Grained (HSG) Poly-Si for High Capacitance Storage Electrodes", Extended Abstracts of the 1991 International Conference on SSDM, pp. 478 –480, 1991. This reference describes a so-called roughened surface technology (to be referred to as an "HSG technology" hereinafter) with which a polysilicon film as an electrode of a capacitor is annealed in vacuum to form small hemispherical grains on the surface of the polysilicon film. An example in which this HSG technology is applied to a DRAM is also known. This example is disclosed in, e.g., "A Capacitor-Over-Bitline (COB) Cell with A Hemispherical Grain Storage Node for 64 Mb DRAMs", IEDM90 Technical Digest, pp. 665–658, 1990, or "Method of Forming A Capacitor", U.S. Pat. No. 5,444,013.

With the HSG technology, the surface area of a polysilicon film as an electrode of a capacitor can be increased. As a consequence, the capacitance required to store data increases, and a desired storage charge amount can be ensured.

When a silicon nitride film is used as the dielectric film of a capacitor, polysilicon is normally used as an electrode material. The HSG technology is advantageous in increasing the electrode area of a capacitor when polysilicon is used as an electrode material.

A method of forming a rough or undulated surface on a polysilicon film as the lower electrode (storage electrode) of a capacitor using the HSG technology will be briefly described. As shown in FIG. 39, an insulating interlayer 2 is formed on a semiconductor substrate (not shown), and then, a contact plug 3 connected to an element region on the semiconductor substrate is formed. Polysilicon is deposited at 550° C. by, e.g., low-pressure CVD. The deposited polysilicon is patterned by the conventional lithography and RIE to form a polysilicon film 601 as the lower electrode of a capacitor. Subsequently, as shown in FIG. 40, after a natural oxide film on the polysilicon film is removed by a diluted HF solution, the resultant structure is annealed in vacuum to obtain a polysilicon film 602 with a rough or undulated surface. With this process, a capacitor having large electrode area and capacitance can be obtained.

Another technique of improving the capacitance to ensure a given data storage charge amount is known. For example, "Giga-bit Scale DRAM Cell with New Simple Ru/(Ba,Sr) TiO$_3$/Ru Stacked Capacitors Using X-ray Lithography", IEDM95 Technical Digest, pp. 903–906, 1995 discloses a technique using a high-dielectric film of (Ba,Sr)TiO$_3$ (to be referred to as a "BSTO" hereinafter) having a high dielectric constant as the dielectric film of a capacitor.

As a semiconductor device becomes further minute in size in feature, both the electrode area of a capacitor and the dielectric constant of a dielectric film need be improved. A technique of combining an electrode having a rough or undulated surface and a high-dielectric film to form a capacitor meets this requirement.

A high-dielectric film such as a BSTO film is a metal oxide film. In the process of depositing a metal oxide film, active oxygen is contained in the atmosphere. When polysilicon is used for the electrode of a capacitor, and BSTO is used for the dielectric film, the polysilicon surface is oxidized during deposition of BSTO to form an SiO$_2$ film having a low dielectric constant. As a result, the capacitance becomes low. Hence, in the prior art, when a metal oxide such as BSTO is used for the dielectric film of a capacitor, a metal such as platinum (Pt) or ruthenium (Ru) must be used as an electrode material.

However, in the use of the above-described HSG technology, a rough pattern can be formed on a polysilicon surface, but it is not possible to form rough pattern on a metal surface. For this reason, when a metal such as platinum or ruthenium is used as the electrode material of a capacitor, the electrode area can hardly be increased.

BRIEF SUMMARY OF THE INVENTION

The present invention has been made in consideration of the above situation, and has as its object to provide a semiconductor memory device including a capacitor having a capacitance improved by a metal electrode having a rough or undulated surface, and a method of manufacturing the same.

According to the present invention, there is provided a capacitor in a semiconductor device, comprising a cylindrical lower electrode having a side wall portion, a bottom portion, and an open upper end, at least the side wall portion of the cylindrical lower electrode being formed in an undulated shape; a dielectric material film being formed to cover the cylindrical lower electrode; and an upper electrode being formed on the dielectric material film to face the cylindrical lower electrode through the dielectric film, wherein the cylindrical lower electrode is made of at least one of a metal and a metal oxide.

In the semiconductor memory device of the invention, the inner and outer surfaces of the side wall portion of the lower electrode are rough or undulated such that one surface corresponds to the other surface in shape. In other words, the side wall is undulated such that a convex portion on the outer surface corresponds with a concave portion on the inner surface, and vice versa. With these rough or undulated surfaces, the surface areas of the lower and upper electrodes of the capacitor increase, and the electrode area of the capacitor is improved. In addition, since a capacitor structure is formed on both surfaces of the side wall portion of the lower electrode, a larger capacitance can be obtained. Hence, the capacitance for data storage can be improved, and the cell area can be reduced.

According to the present invention, there is also provided a capacitor in a semiconductor device, comprising a cylindrical lower electrode having a side wall portion, a bottom portion, and an open upper end, at least the side wall portion of the cylindrical lower electrode being formed in an undulated shape; a dielectric material film being formed to cover the cylindrical lower electrode; and an upper electrode formed on the dielectric material film to face the cylindrical lower electrode through the dielectric film, wherein the inner surface and the outer surface of the side wall portion are curved in parallel.

According to the present invention, there is further provided a capacitor in a semiconductor device, comprising a lower electrode comprising a first conductive material film having an undulated surface and a second conductive material film formed on the undulated surface of the first conductive material film; a dielectric material film being formed to cover an undulated surface of the second conductive material film; and an upper electrode being formed on the dielectric material film to face the lower electrode through the dielectric material film.

According to this semiconductor memory device, since the lower electrode has a rough or undulated surface, a capacitor having a large electrode area can be obtained. Hence, a capacitor with an improved capacitance and a small cell area can be provided.

The conductive material films may be formed on the rough or undulated surface of the silicon semiconductor film by plating.

According to the capacitor of the invention, since a metal film may be formed on the surface of the lower electrode, any chemical reaction between the lower electrode and dielectric film can be suppressed, so the capacitance can be prevented from lowering due to the product of the chemical reaction (e.g., oxidation).

In addition, a reaction barrier layer for suppressing chemical reaction (e.g., silicidation) may be inserted between the lower electrode structure and the metal film. With this arrangement, the quality of the dielectric film can be kept high, and a high-quality semiconductor memory device can be obtained.

According to the present invention, there is provided a method for forming a capacitor in a semiconductor device, comprising the steps of forming a film having an undulated surface; depositing a conductive material film on the film so as to have the shape of the conductive material film conform to the undulated surface of the conductive material film; forming a lower electrode by removing the conductive material film while leaving the film; forming a dielectric material film to cover inner and outer surfaces of the lower electrode; and forming an upper electrode on one surface of the dielectric material film to face the lower electrode through the dielectric material film.

According to this manufacturing method, since a rough pattern is formed on the inner wall of the hole portion in the silicon semiconductor film, and the lower electrode is formed using the silicon semiconductor film as a mould, a rough pattern can be formed on the surface of the lower electrode made of a metal which is difficult to be roughen. The surface of the lower electrode is rough such that convex and concave portions are formed on the outer surface in correspondence with concave and convex portions on the inner surface, so the electrode area of the capacitor is increased. For the dielectric film of the capacitor, a metal oxide can be used. Hence, the capacitance for data storage can be increased, and a semiconductor memory device with a small cell area and high degree of integration can be obtained.

According to the present invention, there is further provided a method for forming a capacitor in a semiconductor device, comprising the steps of forming a film having an undulated surface; forming a lower electrode by forming a conductive material film on the undulated surface of the film; forming a dielectric material film so as to cover one surface of the conductive material film; and forming an upper electrode on the dielectric material film so as to face the lower electrode through the dielectric material film.

According to this manufacturing method, a lower electrode can be provided by forming the conductive material film on the rough or undulated surface of the film. With this arrangement, the electrode area of the capacitor is increased, and the capacitance is improved. Since the capacitor is buried in the insulating layer, planarization after capacitor formation is facilitated, and the subsequent miniaturization process is also facilitated. Hence, a semiconductor memory device having a small cell area and high degree of integration can be obtained.

The conductive material film may be formed by plating.

According to this manufacturing method, a lower electrode can be formed by plating a conductive material on the rough or undulated surface of the film. With this arrangement, the electrode area of the capacitor increases, and oxidation between the silicon semiconductor film and dielectric film can be prevented by the first conductive film. Hence, the capacitance for data storage can be improved, and a semiconductor memory device having a small cell area and high degree of integration can be obtained.

The method may further comprise, between the step of forming a rough or undulated surface on the film and the step of forming the conductive film, forming a reaction barrier layer for suppressing a chemical reaction between the film and the conductive material film. With this arrangement, the quality of the dielectric film can be kept high, and a high-quality semiconductor memory device can be obtained. The conductive material film may be formed by electroplating or electroless plating. For the dielectric film, a high-dielectric material such as a metal oxide can be used. Hence, the capacitance can be further improved, and the storage charge amount can be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
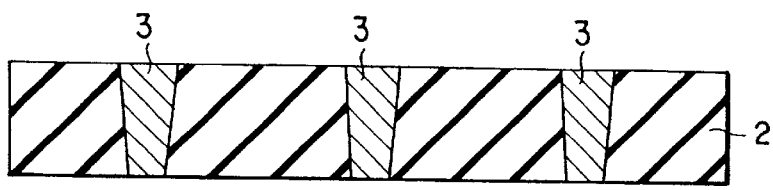
FIG. 1 is a sectional view for explaining the step of forming contact plugs in the first embodiment.

Embodiments of the present invention will be described below with reference to the accompanying drawing. A DRAM will be referred to herein as one example of application of the present invention. The present invention can be applied to any sorts of semiconductor devices having a capacitor structure, such as an FRAM.

The same reference numerals denote the same parts throughout the drawing, and a detailed description thereof will be omitted. In the drawing, no semiconductor substrate is illustrated, and portions associated with a data storage capacitor are extracted and illustrated.

First Embodiment

The first embodiment is related to a DRAM having a stacked capacitor structure called a crown capacitor.

Figure 6:
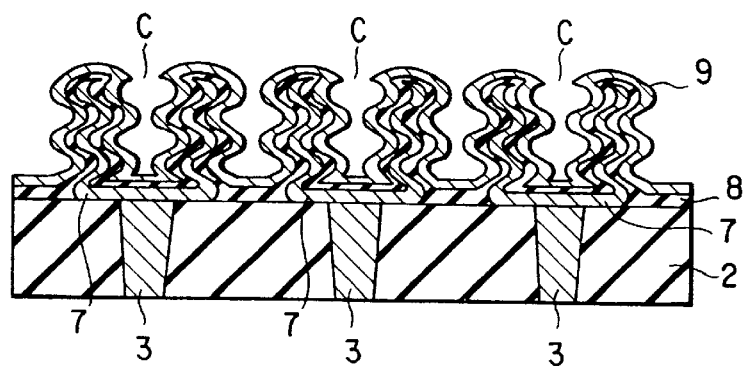
FIG. 6 is a sectional view for explaining the step of forming an upper electrode on the lower electrodes via a dielectric film.

As shown in FIG. 6, data storage capacitors C of a semiconductor memory device according to the first embodiment are formed on an insulating interlayer 2 formed on, e.g., a semiconductor substrate (not shown). Contact plug 3 are buried in the insulating interlayer 2. Each capacitor C comprises a cylindrical lower electrode 7 with an open upper end and bottom portion connected to a corresponding one of the contact plugs 3, a high-dielectric film 8 formed to cover the outer and inner surfaces of the lower electrode 7, and an upper electrode 9 formed on the high-dielectric film 8 to face the lower electrode 7.

The lower electrode 7 has a cylindrical shape whose side wall portion has rough (or undulated) surfaces and an substantially uniform thickness. The lower electrode 7 is connected to a cell transistor formed on the semiconductor substrate (not shown) through the contact plug 3. The high-dielectric film 8 having a substantially uniform thickness is formed to cover the lower electrode 7. The upper electrode 9 is formed to cover the high-dielectric film 8 and face the lower electrode 7. The upper electrode 9 functions as a common plate electrode for a plurality of capacitors. A predetermined plate voltage is applied to the upper electrode 9. The surface of the upper electrode 9 facing the lower electrode 7 has a shape conforming to the surface shape of the lower electrode 7. Consequently, the distance between the lower electrode 7 and upper electrode 9 is kept substantially uniform at any portions.

A method of manufacturing the semiconductor memory device and, more specifically, the crown capacitor structure of the first embodiment will be described below. First, as shown in FIG. 1, an insulating interlayer 2 such as a silicon oxide film is deposited on a semiconductor substrate (not shown). Holes are formed in the insulating interlayer 2, and contact plugs 3 for electrically connecting capacitors (to be described later) with transistors (not shown) on the semiconductor substrate are formed in the holes.

Figure 2:
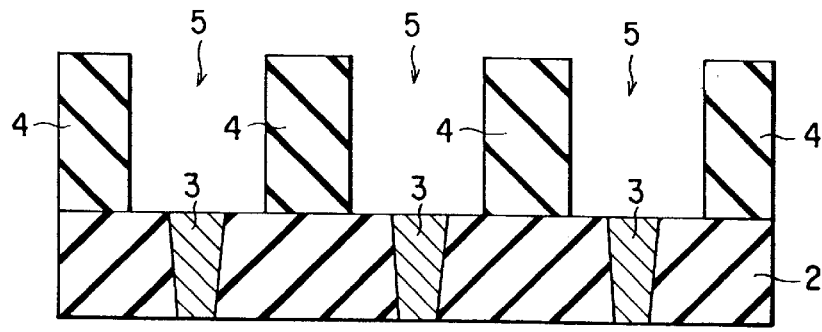
FIG. 2 is a sectional view for explaining the step of forming hole portions in the first embodiment.

As shown in FIG. 2, a polysilicon film 4 (silicon semiconductor film) as a dummy film is deposited on the insulating interlayer 2 at 550° C. by, e.g., low-pressure CVD. Hole portions 5 are formed in the polysilicon film 4 to be located above the contact plugs 3 by, e.g., photolithography and etching. After this, a natural oxide film (not shown) is removed by using, e.g., a diluted HF solution.

Figure 3:
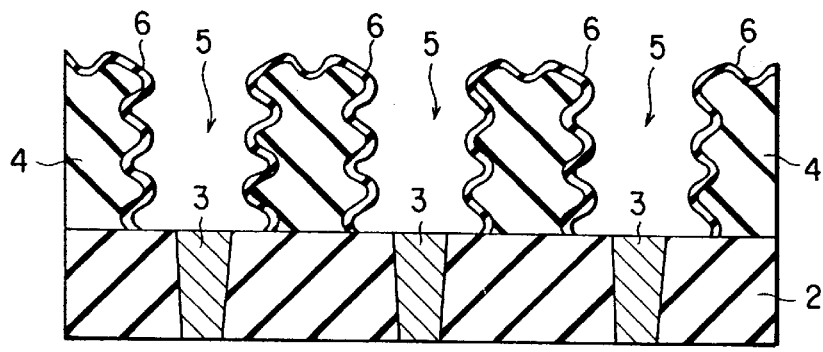
FIG. 3 is a sectional view for explaining the step of forming a rough or undulated polysilicon surface in the first embodiment.

As shown in FIG. 3, the polysilicon film 4 is annealed in a non-oxidizing atmosphere (e.g., in vacuum, Ar, H or the like) using, e.g., the HSG technology to form a rough or undulated surface on the polysilicon film 4. As the HSG technology, not only a method of annealing the polysilicon film 4 in a non-oxidizing atmosphere to form a rough or undulated polysilicon surface, as described above, but also a method of depositing an HSG polysilicon layer on a doped polysilicon surface is known. The first and subsequent embodiments will be described assuming that the former method is applied. However, the present invention can also be practiced by applying the latter method or other HSG technologies.

Subsequently, the resultant structure is annealed in an oxygen atmosphere to oxidize the surface of the polysilicon film 4, thereby forming a thin silicon oxide film 6.

Figure 4:
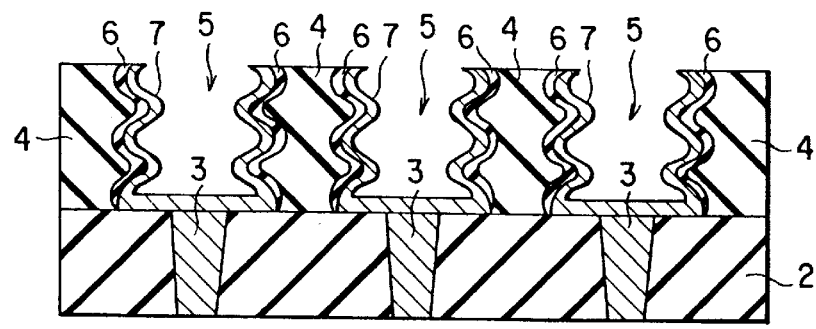
FIG. 4 is a sectional view for explaining the step of forming a conductive film as a lower electrode in the first embodiment.

As shown in FIG. 4, a metal film (first conductive film) of, e.g., ruthenium (Ru) as a lower electrode 7 is deposited by, e.g., CVD to cover the polysilicon film 4 on which the silicon oxide film 6 is formed, and the bottom surfaces of the hole portions 5. The first conductive film serving as an electrode can be formed from a metal or an alloy or oxide thereof. For example, Re, Os, Rh, Ir, or Sr, an oxide thereof, an alloy thereof, an oxide of the alloy (for instance, SRO), or W, Nb, Al, Ti, Ta, Mo, Cu, WN, TaN, Pd, Fe, Mn, Cr, Co, or Ni can be used as an electrode material. In the embodiments to be described later, films formed from these materials can be used as electrodes.

After this, the upper portion of the lower electrode 7 and the upper portion of the polysilicon film 4 on which the silicon oxide film 6 is formed are removed and planarized by, e.g., CMP (Chemical Mechanical Polishing). With this process, a plurality of lower electrodes 7 are formed to be isolated from each other. At this time, the lower electrodes 7 are buried in the hole portions 5 and connected to the contact plugs 3 at their bottom portions.

Figure 5:
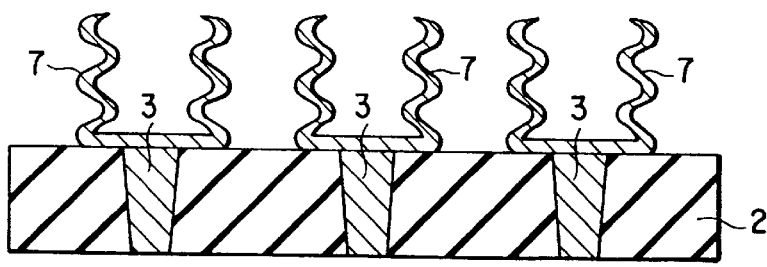
FIG. 5 is a sectional view for explaining the step of removing the polysilicon film in the first embodiment.

Next, as shown in FIG. 5, the polysilicon film 4 (unoxidized portion) is removed, and then, the silicon oxide film 6 (oxidized portion of the polysilicon film 4) is removed by, e.g., CDE (Chemical Dry Etching). As a result, the inner and outer surfaces of each crown-shaped lower electrode are exposed. That is, in this embodiment, the cylindrical lower electrodes 7 having rough or undulated inner and outer surfaces as the side wall portions are formed using the polysilicon film 4 having a rough or undulated surface shown in FIGS. 3 and 4 as a mould.

Next, as shown in FIG. 6, a high-dielectric film 8 (dielectric film) of a metal oxide film of, e.g., BSTO is deposited on the inner and outer surfaces of the lower electrodes 7. Film 8 may be made of a ferroelectric material or a dielectric material. As for the metal oxide used for the film 8, $BaTiO_3$, $SrTiO_3$, $PbZrO_3$, $LiNbO_3$, $Bi_4Ti_3O_{12}$, or $Ta_2O_5$ may be used. Further, an alkaline earth metal or a rare earth metal may be used as a material of the dielectric film, in combination with the above metal oxides. In the embodiments to be described later, these metal oxides or materials can be used as a dielectric film of the capacitor according to the invention.

After this, a metal film (second conductive film) of ruthenium (Ru) is deposited on the high-dielectric film 8 by using, e.g., CVD to form an upper electrode 9 that faces the inner and outer surfaces of the lower electrodes 7.

With the above process, a crown-type stacked capacitor structure having a cylindrical lower electrode 7 having rough or undulated inner and outer surfaces and an upper electrode 9 facing the lower electrode 7 via a high-dielectric film 8 is obtained.

Note that a metal such as ruthenium reacts with polysilicon at a relatively low temperature to form a silicide and thereby to influence the quality of a dielectric film. However, according to the first embodiment, before the lower electrode 7 is formed by depositing ruthenium or the like, the surface of the polysilicon film 4 is covered with the silicon oxide film 6, so silicidation is suppressed. Hence, the influence on the quality of the high-dielectric film 8 can be eliminated, and a leakage current due to the degradation in film quality of the high-dielectric film 8 can be suppressed.

According to the first embodiment, the inner and outer surfaces of the side wall portion of the lower electrode 7 formed from a metal such as platinum or ruthenium are formed in an undulated shape. Hence, the inner and outer surfaces of the lower electrode 7 can be effectively used, and the electrode area of the capacitor can be increased. In addition, since a high-dielectric film of, e.g., BSTO can be used as the dielectric film of the capacitor, a capacitor structure having a small cell area and large capacitance can be obtained.

According to the first embodiment, in forming the lower electrode 7, the polysilicon film 4 is used as a mould. The polysilicon film 4 on the underlying insulating interlayer 2 (e.g., silicon oxide film) can be easily selectively etched and removed. For this reason, the insulating interlayer 2 is not undesirably etched, and the planarity in the element region is not disturbed.

Figure 7:
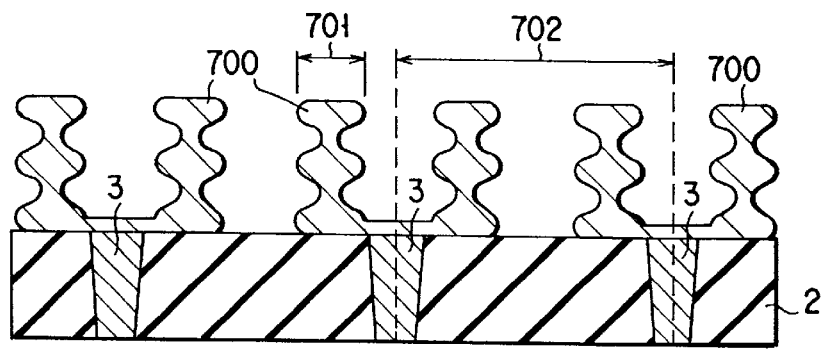
FIG. 7 is a sectional view showing a comparative example of lower electrodes.

In a comparative example shown in FIG. 7, when a rough or undulated surface is formed on a cylindrical polysilicon film to form lower electrodes 700, the inner and outer side surfaces of the side wall portion of each lower electrode 700 independently form ragged patterns. For this reason, a thickness 701 of each lower electrode 700 is increased by an amount corresponding to the height of the formed convex portions, and an arrangement pitch 702 of the lower electrodes 700 is increased, resulting in failure of high-degree of integration.

Figure 8:
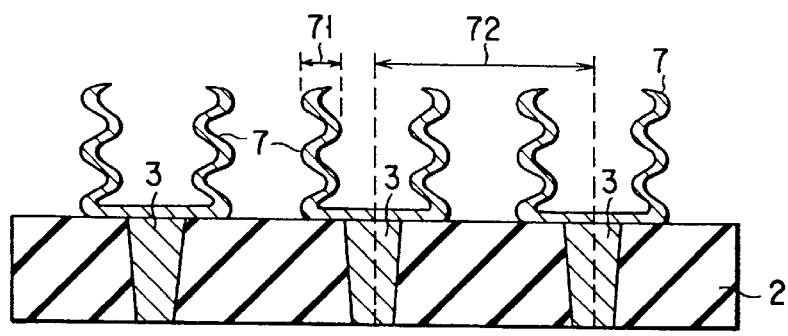
FIG. 8 is a sectional view showing the lower electrodes of the first embodiment in comparison with the comparative example of lower electrodes.

To the contrary, according to the first embodiment, the thickness of the side wall portion of each lower electrode 7 is determined by the thickness of the metal film as the lower electrode 7, as shown in FIG. 4. When the lower electrode 700 shown in FIG. 7 is compared with the lower electrode of the present invention, which has the same surface area as that of the lower electrode 700, a thickness 71 and arrangement pitch 72 of the lower electrode 7 of the present invention are smaller, as shown in FIG. 8. Hence, in the capacitor of the present invention, not only when a high-dielectric film of, e.g., BSTO is used as a dielectric film but also when a silicon nitride film is used as a dielectric film, the cell area can be reduced, and the degree of integration can be increased.

Second Embodiment

The second embodiment of the present invention is directed to a semiconductor memory device having a stacked capacitor structure of a trench type. An example will be described below.

Figure 13:
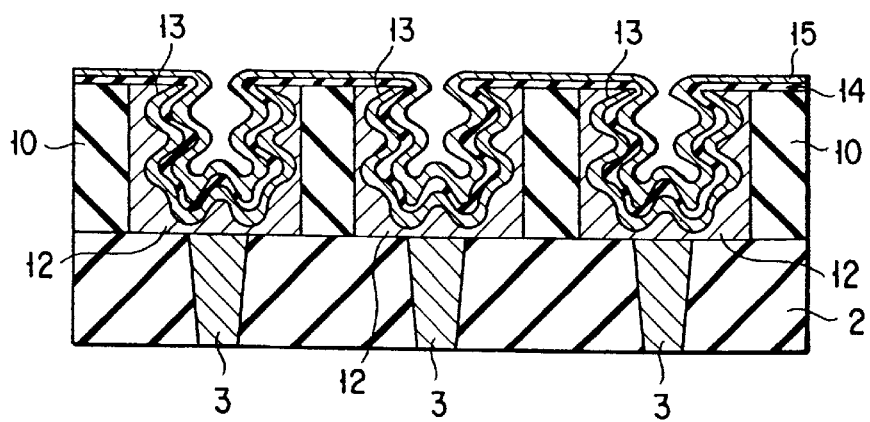
FIG. 13 is a sectional view for explaining the step of forming an upper electrode on each lower electrode via a dielectric film in the second embodiment.

Capacitors of the second embodiment are formed on a semiconductor substrate (not shown) via an insulating interlayer 2 in which contact plugs 3 are buried, as shown in FIG. 13. Each capacitor comprises a polysilicon film 12 having a concave portion with a rough or undulated surface, a metal film 13 formed on the rough or undulated surface of the polysilicon film 12, a dielectric film 14 formed to cover the surface of the metal film 13, and an upper electrode 15 formed on the dielectric film 14 to face the metal film 13.

Each polysilicon film 12 is connected to a corresponding contact plug 3 at its bottom portion. The polysilicon film 12 has a cylindrical concave portion having an open upper end. A rough or undulated pattern is formed on the inner-side surface of the concave portion (to be simply referred to as an "inner surface" hereinafter). The metal film 13 is formed on the inner surface (rough or undulated surface) of the polysilicon film 12. The rough pattern of the polysilicon film 12 is transferred to the shape of the metal film 13. The metal film 13 functions as lower electrodes (no reference numeral) together with the polysilicon film 12.

A method of manufacturing the semiconductor memory device according to the second embodiment will be described with an emphasis on this trench-type capacitor structure.

Figure 9:
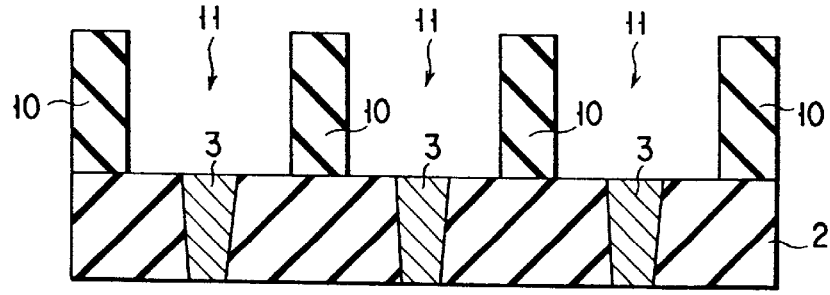
FIG. 9 is a sectional view for explaining the step of forming hole portions in an insulating interlayer in the second embodiment.

As in the first embodiment, an insulating interlayer 2 such as a silicon oxide film is formed on the semiconductor substrate, and contact plugs 3 are buried at necessary portions. After this, as shown in FIG. 9, an insulating layer 10 such as a silicon oxide film is deposited. Hole portions 11 are formed in the insulating layer 10 by, e.g., photolithography and etching. The hole portions 11 are formed above the contact plugs 3, respectively.

Figure 10:
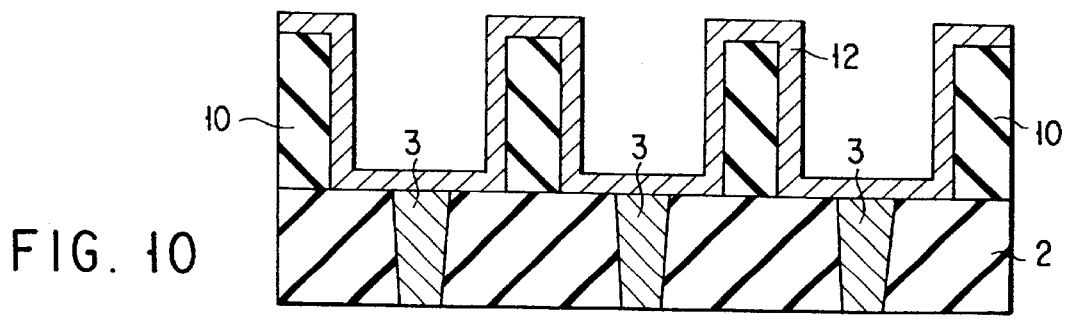
FIG. 10 is a sectional view for explaining the step of forming a polysilicon film in the second embodiment.
Figure 11:
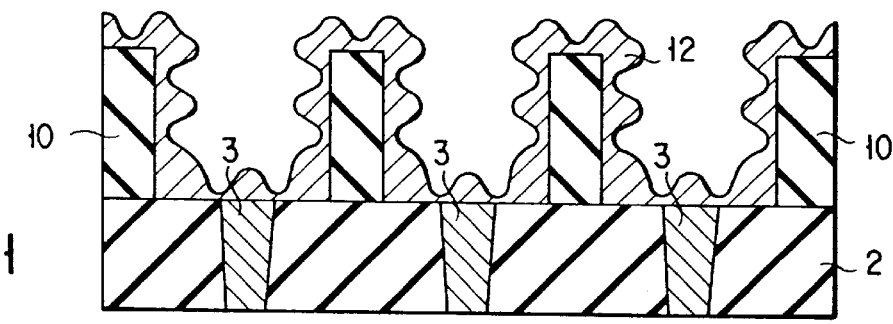
FIG. 11 is a sectional view for explaining the step of forming a polysilicon film having undulated surface in the second embodiment.

As shown in FIG. 10, a thin polysilicon film 12 is deposited to cover the insulating layer 10 and bottom surfaces of the hole portions 11. Next, as shown in FIG. 11, the polysilicon film 12 is processed to form hemispherical concave and convex portions on its surface by, e.g., annealing the resultant structure.

Figure 12:
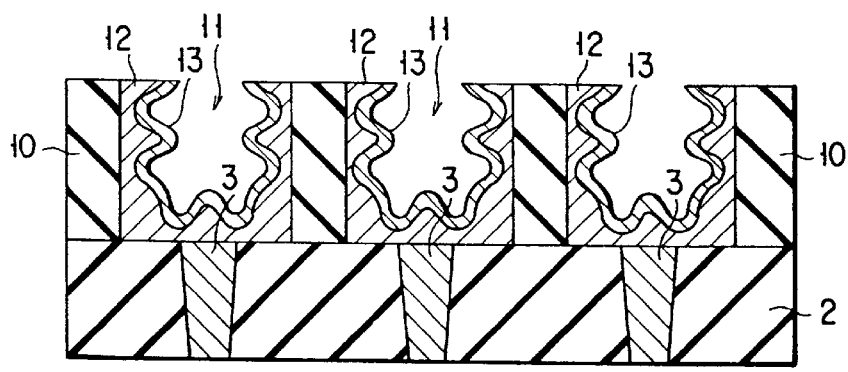
FIG. 12 is a sectional view for explaining the step of forming lower electrodes on the polysilicon film in the second embodiment.

As shown in FIG. 12, a metal film 13 (first conductive film) of, e.g., ruthenium is formed on the surface of the polysilicon film 12 having the concave and convex portions. The upper portions of the insulating layer 10, metal film 13, and polysilicon film 12 are removed and planarized by, e.g., CMP. With this process, the polysilicon film 12 is divided into a plurality of polysilicon portions 12A electrically isolated from one another. Each polysilicon portion has a cylindrical concave portion. Each polysilicon portion 12A and metal film 13 on the rough or undulated surface of the polysilicon portion 12A form one lower electrode.

Subsequently, as shown in FIG. 13, a high-dielectric film 14 of, e.g., BSTO is deposited on metal film 13, to form a dielectric film 14 for a capacitor. Then, ruthenium, e.g., is deposited on the dielectric film 14 to form an upper electrode 15, thus completing a trench-type stacked capacitor structure.

The second embodiment has the following effects.

In the above-described first embodiment, the polysilicon film used as a mould in forming the lower electrode is removed. However, according to the second embodiment, the polysilicon film 12 forms lower electrodes together with the metal film 13. Hence, the process of removing the polysilicon film 12 can be omitted.

In the first embodiment, the polysilicon film 4 must be made thick. However, according to the second embodiment, the polysilicon film 12 can have a minimum thickness necessary for formation of hemispherical concave and convex portions and need not be deposited thick.

The first embodiment requires the process of forming the oxide film 6 to avoid silicidation caused between the polysilicon film 4 and lower electrode 7. However, according to the second embodiment, the process for avoiding silicidation can be omitted. More specifically, in the process of forming the trench capacitor of the second embodiment, silicidation takes place between the polysilicon film 12 and the outer surface of the metal film 13 because of its structure. However, since the high-dielectric film 14 is formed on only the inner surface side of the metal film 13, the film quality of the high-dielectric film 14 can be prevented from being influenced by silicidation. Hence, silicidation need not necessarily be avoided, and the process of forming an oxide film for avoiding silicidation can be omitted. This feature reduces the number of high-temperature processes, so satisfactory device characteristics can be maintained.

In addition, according to the second embodiment, since the trench capacitor structure is employed, the memory cell portions and peripheral circuit portions may become almost flush with each other after formation of the capacitor, and thus planarization is facilitated. With this structure, miniaturization in subsequent photolithography processes can be facilitated.

Third Embodiment

The third embodiment of the present invention will be described. In the third embodiment, in the capacitor structure according to the second embodiment shown in FIG. 13, a reaction barrier layer for suppressing silicidation is inserted between the polysilicon film 12 and metal film 13.

Figure 14:
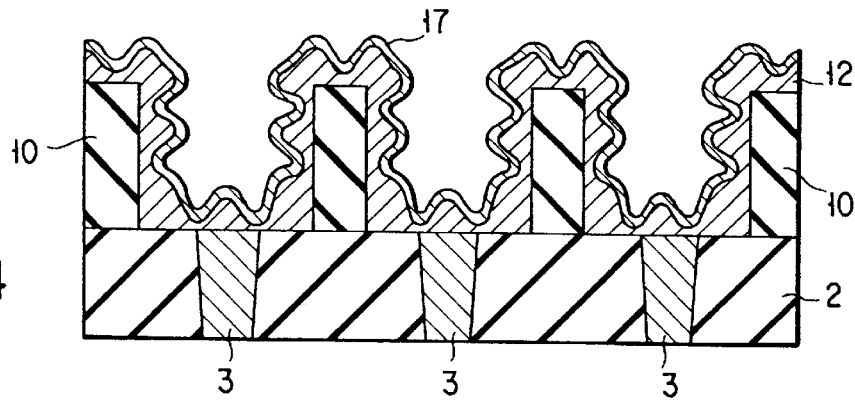
FIG. 14 is a sectional view for explaining the step of forming a reaction barrier layer in the third embodiment.
Figure 15:
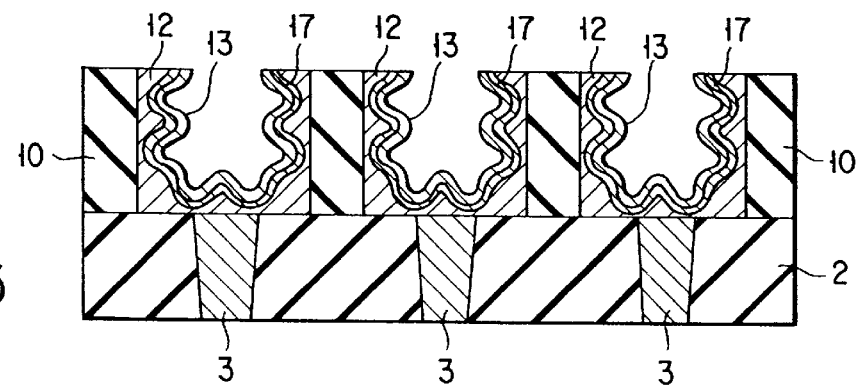
FIG. 15 is a sectional view for explaining the step of forming lower electrodes on the reaction barrier layer in the third embodiment.
Figure 16:
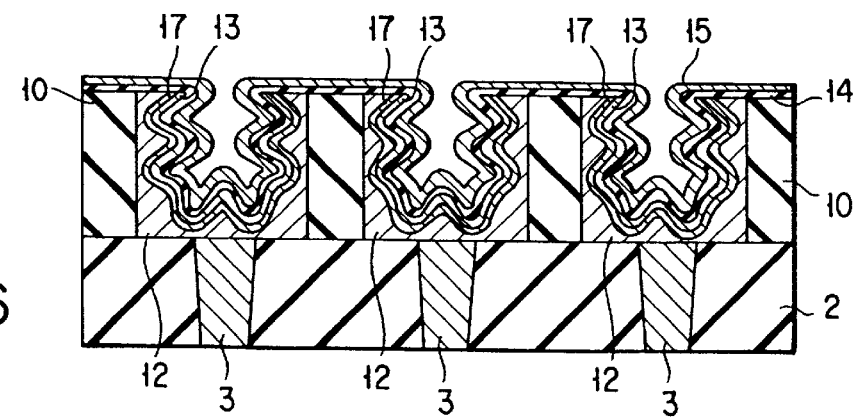
FIG. 16 is a sectional view for explaining the step of forming an upper electrode on each lower electrode via a dielectric film in the third embodiment.

A method of manufacturing a semiconductor memory device according to the third embodiment will be described, focusing on this trench capacitor structure. As in the second embodiment, the structure shown in FIG. 11 is formed. After this, as shown in FIG. 14, a reaction barrier layer 17 formed from TiN or a multilayered film (conductive film) of Ti and TiN is deposited. Alternatively, the reaction barrier layer may be formed by plating. After a metal film 13 (first conductive film) of, e.g., ruthenium is deposited on the surface of the reaction barrier layer 17, the upper portion of an insulating interlayer 10, and those parts of the metal film 13, reaction barrier layer 17, and polysilicon film 12, which are positioned at the upper portion are removed by, e.g., CMP to planarize the structure, as shown in FIG. 15. With this process, the polysilicon film 12 is divided into a plurality of polysilicon portions 12A electrically isolated from one another. Each polysilicon portion has a cylindrical concave portion. Each polysilicon portion 12A and metal film 13 formed on the rough or undulated surface of the polysilicon portion 12A form one lower electrode. As shown in FIG. 16, after BSTO or the like is deposited to form a high-dielectric film 14, ruthenium or the like is deposited to form an upper electrode 15, this completing a trench-type stacked capacitor structure.

According to the third embodiment, the following effects can be obtained. The reaction barrier layer 17 formed from, e.g., TiN acts as a barrier metal layer to prevent the metal film 13 as a lower electrode from reacting with the polysilicon film 12 and forming a silicide. With this process, a semiconductor memory device with higher reliability and yield can be obtained.

When the reaction barrier layer 17 of, e.g., TiN is formed, the adhesion between the polysilicon film 12 and metal film 13 can be improved. When the upper portion of the insulating interlayer 10 is removed using CMP, as in the third embodiment, and the adhesion between the polysilicon film 12 and metal film 13 is poor, the metal film 13 may be peeled away, so that the yield can be lowered. However, since adhesion between the polysilicon film 12 and metal film 13 is increased by the reaction barrier layer 17, the metal film 13 is hardly peeled. Hence, the lower electrode can be more properly and easily formed, and thus this embodiment can prevent the yield from getting worse.

Further, when the reaction barrier layer 17 is formed, the metal film 13 can be easily deposited. When the metal film 13 is to be deposited by, e.g., CVD, the deposition rate or film quality of the metal film 13 may depend on the underlying material under certain process conditions. According to the third embodiment, the reaction barrier layer 17 decreases the influence of variations in the underlying layer, so the film quality of the metal film 13 can be optimized. When the metal film 13 is to be deposited by, e.g., plating, the potential across the wafer is readily uniformed by covering the entire surface of the wafer with a reaction barrier layer 17 in advance. As a consequence, the field distribution is improved, and a reliable capacitor electrode with a low defect density can be formed.

Fourth Embodiment

The fourth embodiment relates to a method of manufacturing a semiconductor memory device which has the same crown capacitor structure as that of the first embodiment. The fourth embodiment will be described down below.

First, as in the first embodiment, an insulating interlayer 2 such as a silicon oxide film is formed on a semiconductor substrate (not shown), and contact plugs 3 are formed at necessary portions.

Figure 17:
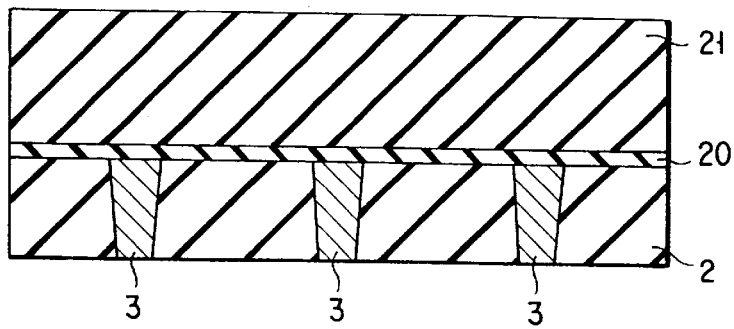
FIG. 17 is a sectional view for explaining the step of forming an insulating interlayer in the fourth embodiment.
Figure 18:
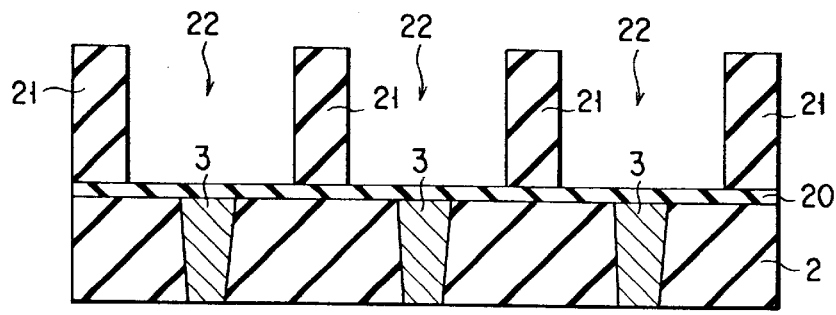
FIG. 18 is a sectional view for explaining the step of forming hole portions in the insulating interlayer in the fourth embodiment.

As shown in FIG. 17, after a thin insulating interlayer 20 (first insulating layer) such as a silicon nitride film is deposited on the insulating interlayer 2 having the contact plugs 3 as an etching stopper layer, an insulating interlayer 21 (second insulating layer) such as a silicon oxide film is deposited. Subsequently, as shown in FIG. 18, hole portions 22 for forming capacitors are formed in the insulating interlayer 21 to be located above the contact plugs 3 using, e.g., photolithography and anisotropic etching.

Figure 19:
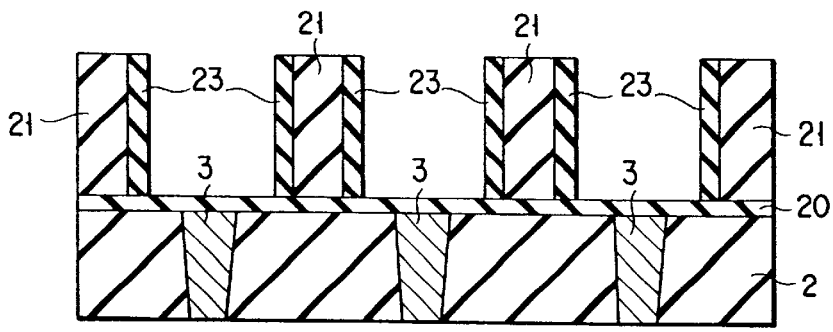
FIG. 19 is a sectional view for explaining the step of forming a polysilicon film on the inner wall of each hole portion in the fourth embodiment.

As shown in FIG. 19, a polysilicon film 23 is formed on the inner wall of each hole portion 22 formed in the insulating interlayer 21. More specifically, after a polysilicon film is deposited to cover the entire surface of the wafer, the polysilicon film 23 is anisotropically etched to leave the polysilicon film 23 on only the inner wall of each hole portion 22.

Figure 20:
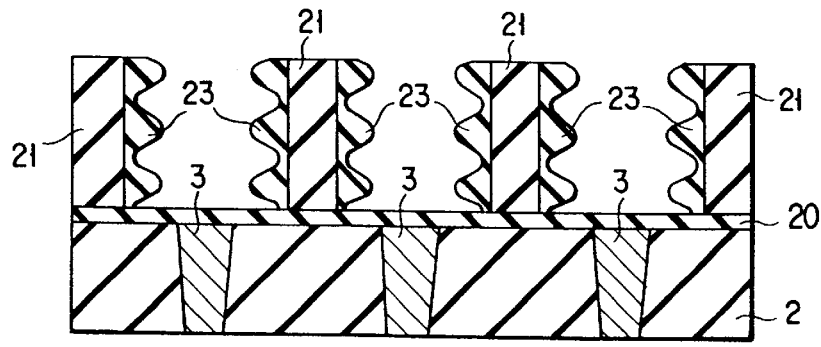
FIG. 20 is a sectional view for explaining the step of forming a polysilicon film having undulated surface in the fourth embodiment.
Figure 21:
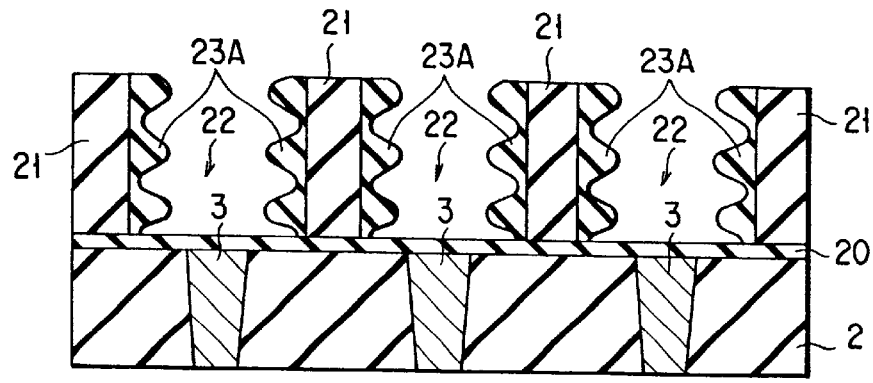
FIG. 21 is a sectional view for explaining the step of converting the polysilicon film into a silicon oxide film in the fourth embodiment.

As shown in FIG. 20, the resultant structure is annealed in vacuum to form concave and convex portions on the surface of the polysilicon film 23. Hemispherical concave and convex portions are formed on the surface of the polysilicon film 23. The resultant structure is annealed in an oxygen atmosphere to oxidize the polysilicon film 23 and convert it into a silicon oxide film 23A having hemispherical concave and convex portions, as shown in FIG. 21.

Figure 22:
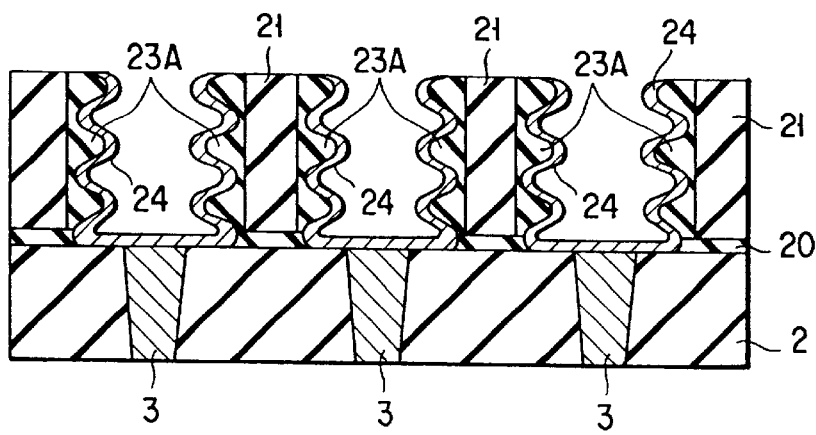
FIG. 22 is a sectional view for explaining the step of forming lower electrodes on the silicon oxide film in the fourth embodiment.

As shown in FIG. 22, the thin insulating interlayer 20 on the bottom surface of each hole portion 22 is removed, and a metal film (first conductive film) of, e.g., ruthenium is deposited to cover the surfaces of the silicon oxide films 23A and the bottom surfaces of the hole portions 22. After this, the same processing as in the first embodiment is performed to form independent cylindrical lower electrodes 24.

Figure 23:
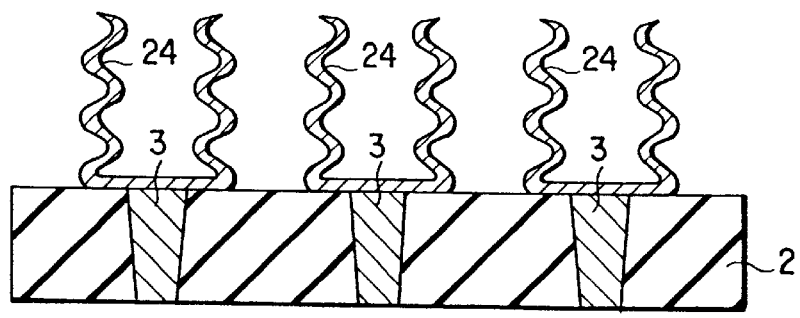
FIG. 23 is a sectional view for explaining the step of removing the insulating interlayer and the like in the fourth embodiment.

As shown in FIG. 23, after the insulating interlayer 21 and silicon oxide films 23A are removed by, e.g., CDE, the insulating interlayer 20 is removed by, e.g., CDE to obtain the crown-shaped lower electrodes 24 with their inner and outer surfaces being exposed. The insulating interlayer 20 can be removed as needed or may be left.

Figure 24:
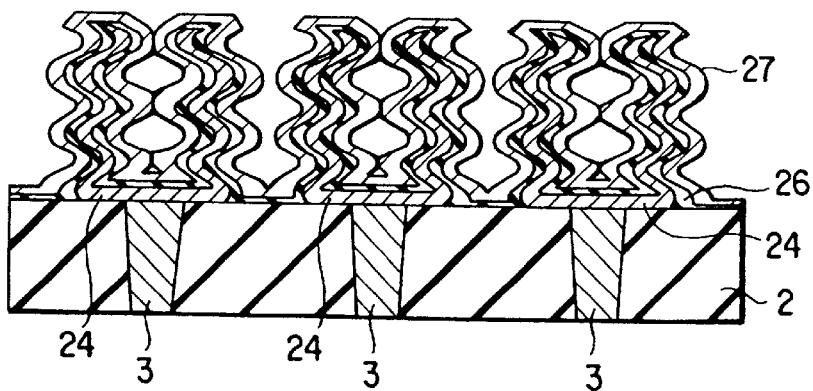
FIG. 24 is a sectional view for explaining the step of forming an upper electrode on each lower electrode via a dielectric film.

Finally, as shown in FIG. 24, BSTO or the like is deposited to form a high-dielectric film 26 to cover the lower electrodes 24, and ruthenium or the like (second conductive film) is deposited to form an upper electrode 27. With this process, the same crown-type stacked capacitor structure as in the first embodiment shown in FIG. 6 is obtained.

According to the fourth embodiment, the following effects can be obtained. Since the polysilicon film 23 is oxidized and converted into the silicon oxide film 23A, silicidation between the lower electrodes 24 and polysilicon film 23 is prevented. In addition, the silicon oxide film 23A can be removed simultaneously with removal of the insulating interlayer 21, so the process of removing the polysilicon film 23 can be omitted.

The volume of the polysilicon film 23 increases when it changes to the silicon oxide film 23A. This makes the surface pattern on the silicon oxide film 23A more rough and increases the surface area. Hence, the electrode area of each capacitor C further increases to result in a large capacitance.

A thin insulating interlayer 20 having a different etching rate may be deposited under the insulating interlayer 21. Because of the insulating interlayer 20, the etching depth can be accurately controlled in removal of the insulating interlayer 21 by etching. In addition, since the surfaces of the contact plugs 3 are covered with the insulating interlayer 20 immediately before the lower electrodes 24 are formed, the surfaces of the contact plugs 3 do not oxidize in the process of depositing the insulating interlayer 21 or oxidizing the polysilicon film 23. Hence, a uniform and good electrical connection state can be maintained between the lower electrodes 24 and the element regions on the semiconductor substrate.

Fifth Embodiment

The fifth embodiment of the present invention relates to a method of manufacturing a structure including the MOS transistors and peripheral circuits of a memory cell. The fifth embodiment will be explained on the basis of an example where the capacitor structure by way of the fourth embodiment is applied to a DRAM having a COB (Capacitor Over Bit-line) structure.

Figure 25:
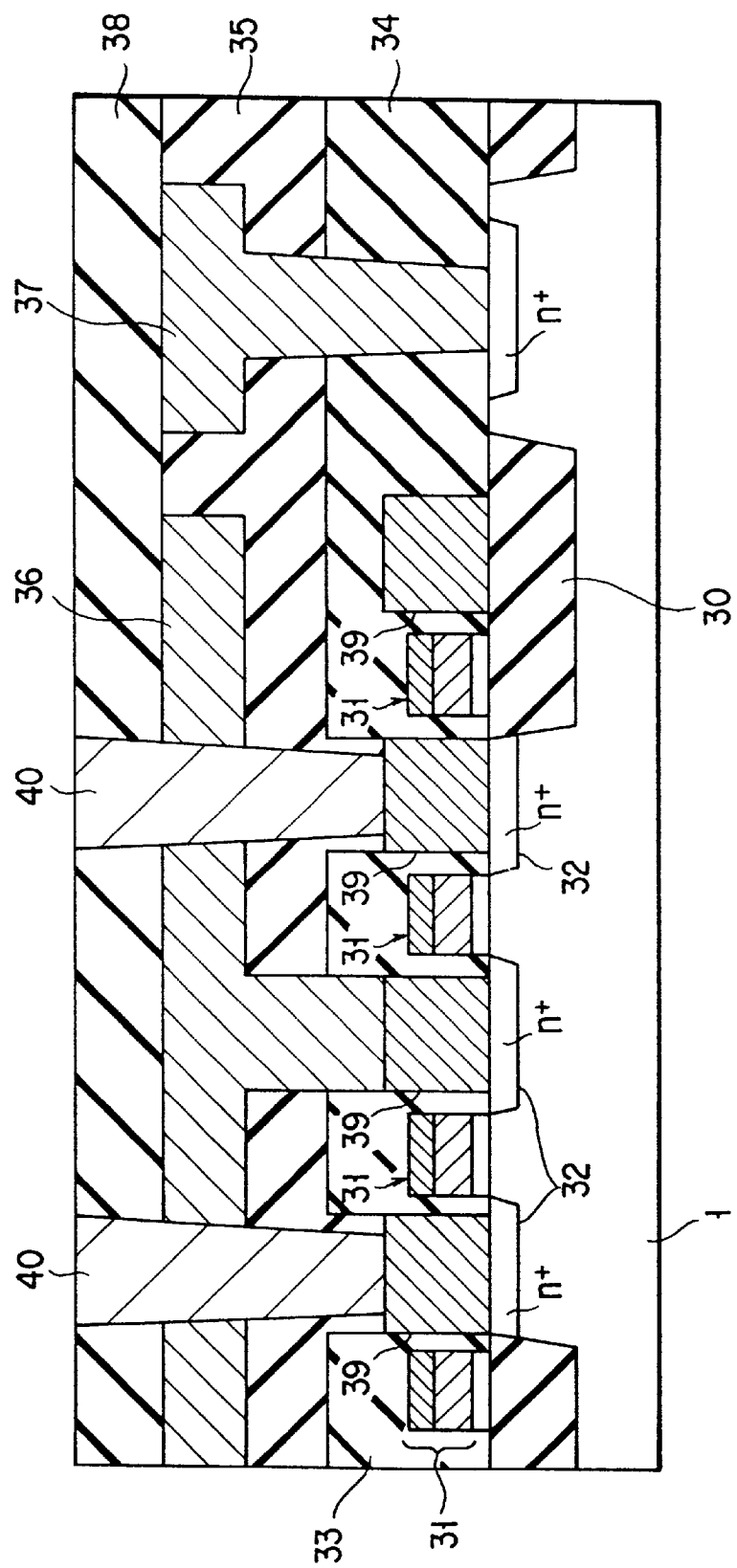
FIG. 25 is a sectional view for explaining the manufacture of a DRAM before formation of capacitors in the fifth embodiment.

First, using a method described in S. P. Sim et al., "A New Planar Stacked Technology (PST) for Scaled and Embedded DRAMs", IEEE, IEDM, pp. 96–597, 1996, a COB structure is formed on a semiconductor substrate 1, as shown in FIG. 25. FIG. 25 shows the sectional structure of a memory cell portion and a peripheral circuit portion. For the descriptive convenience, the structure behind the section position is also illustrated.

As shown in FIG. 25, MOS transistors are formed on the semiconductor substrate 1. In the memory cell portion, a plurality of MOS transistors are formed in a matrix. More specifically, an element isolation region 30 formed from, e.g., a silicon oxide film is formed in a region other than the element region on the semiconductor substrate 1. Gate electrodes 31 each having a multilayered structure of, e.g., polysilicon and tungsten are formed in the element region of the semiconductor substrate 1 via a gate oxide film (no reference numeral). Source/drain regions 32 are formed in self-alignment with the gate electrodes 31. First contact plugs 39 are formed and electrically connected to the source/drain regions 32, respectively. Each gate electrode 31 is covered with an insulating film 33 formed from, e.g., a silicon nitride film. The gate electrodes 31 of the plurality of MOS transistors are patterned to run in the row direction (direction perpendicular to the page of FIG. 25) and form word lines.

Next, bit lines are formed to connect the sources or drains of the plurality of MOS transistors formed on the semiconductor substrate 1 in the column direction (left-and-right direction of the page of FIG. 25). More specifically, after an insulating interlayer 34 formed from, e.g., a silicon oxide film is formed to be substantially flush with the insulating films 33, an interconnection layer 35 formed from, e.g., a silicon oxide film is formed on the entire surface. An interconnection layer 36 (bit line) having a multilayered structure of, e.g., titanium nitride and tungsten is buried in the interconnection layer 35 by, e.g., a damascene method. The interconnection layer 36 is electrically connected to the source/drain region 32 as the source or drain of a transistor through the contact plug 39.

On the interconnection layer 35 in the region of the peripheral circuit portion, an interconnection layer 37 having a multilayered structure of, e.g., titanium nitride and tungsten is formed by the same process as that in forming the interconnection layer 37 of the memory cell array. This interconnection layer 37 is connected to each element region of the peripheral circuits. An insulating interlayer 38 formed from, e.g., a silicon oxide film is formed on the interconnection layer 35 having the interconnection layers 36 and 37 formed thereon.

Second contact plugs 40 of, e.g., polysilicon are formed to extend through the plurality of insulating interlayers such as the insulating interlayers 34, 35, and 38 to connect capacitors. The contact plugs 40 are connected to the contact plugs 39 which are not connected to the bit line.

In FIG. 25, the interconnection layer 36 is apparently separated by the contact plugs 40. However, the contact plugs 40 are formed in front of the interconnection layer 36 in the figure. The bit line formed from the interconnection layer 36 is electrically insulated from the contact plugs 40 and consecutively formed in the left-and-right direction of the figure.

Figure 26:
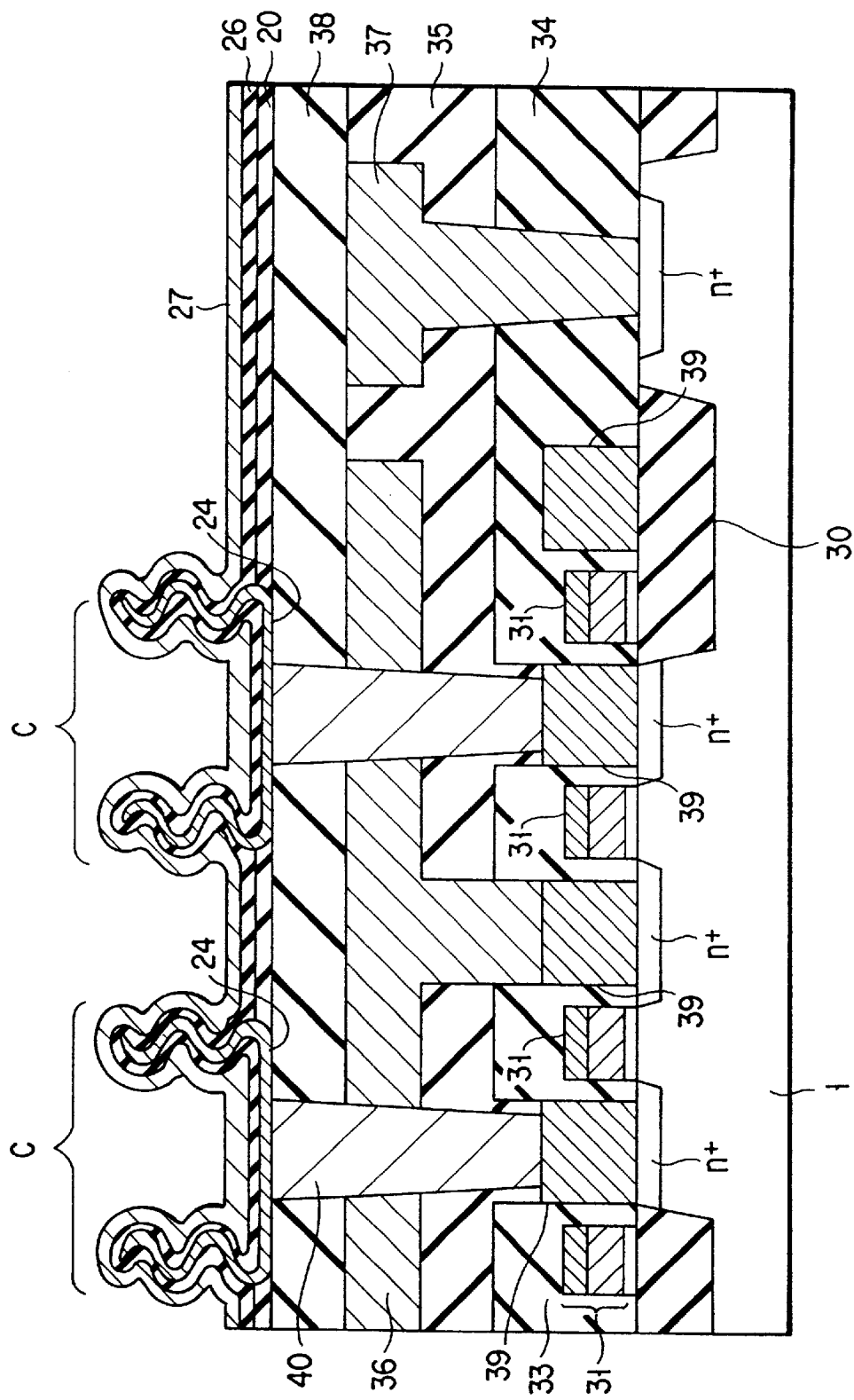
FIG. 26 is a sectional view for explaining the manufacture of capacitors in the fifth embodiment.

With the processes of the fourth embodiment shown in FIGS. 17 to 24, a plurality of stacked capacitors C for data storage are formed on the insulating interlayer 38, as shown in FIG. 26. Lower electrodes 24 of the capacitors C are electrically connected to the source/drain regions 32 (nodes which are not connected to the bit line) of the MOS transistors formed on the semiconductor substrate 1 through the contact plugs 40, respectively. A conductive film 27 constructing an upper electrode is patterned by, e.g., photolithography and etching.

In the fourth embodiment, the insulating interlayer 20 is removed. In the fifth embodiment, however, an insulating interlayer 20 is left to decrease the number of processes.

Figure 27:
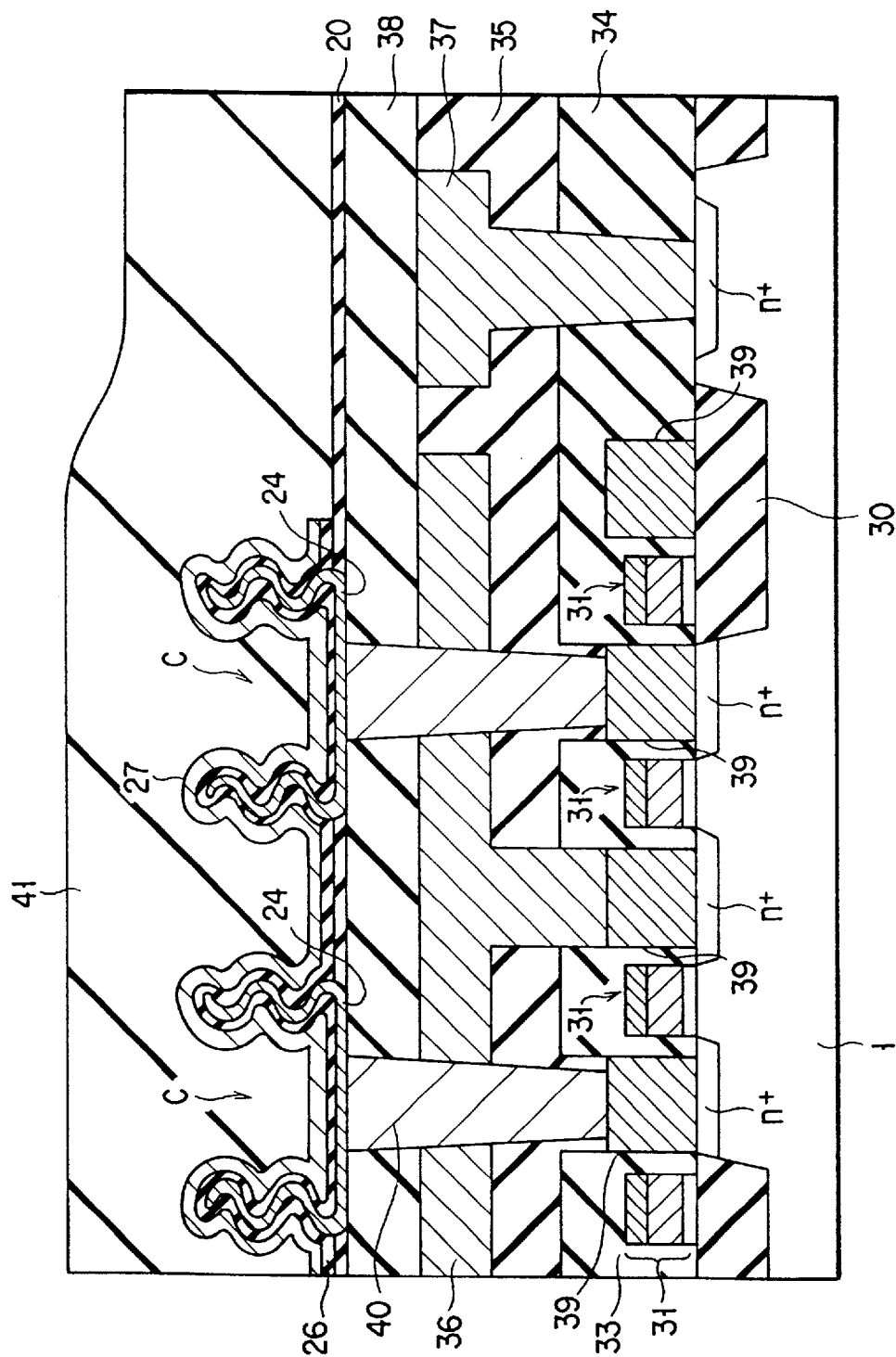
FIG. 27 is a sectional view for explaining the manufacture of a DRAM (insulating interlayer) after formation of capacitors in the fifth embodiment.
Figure 28:
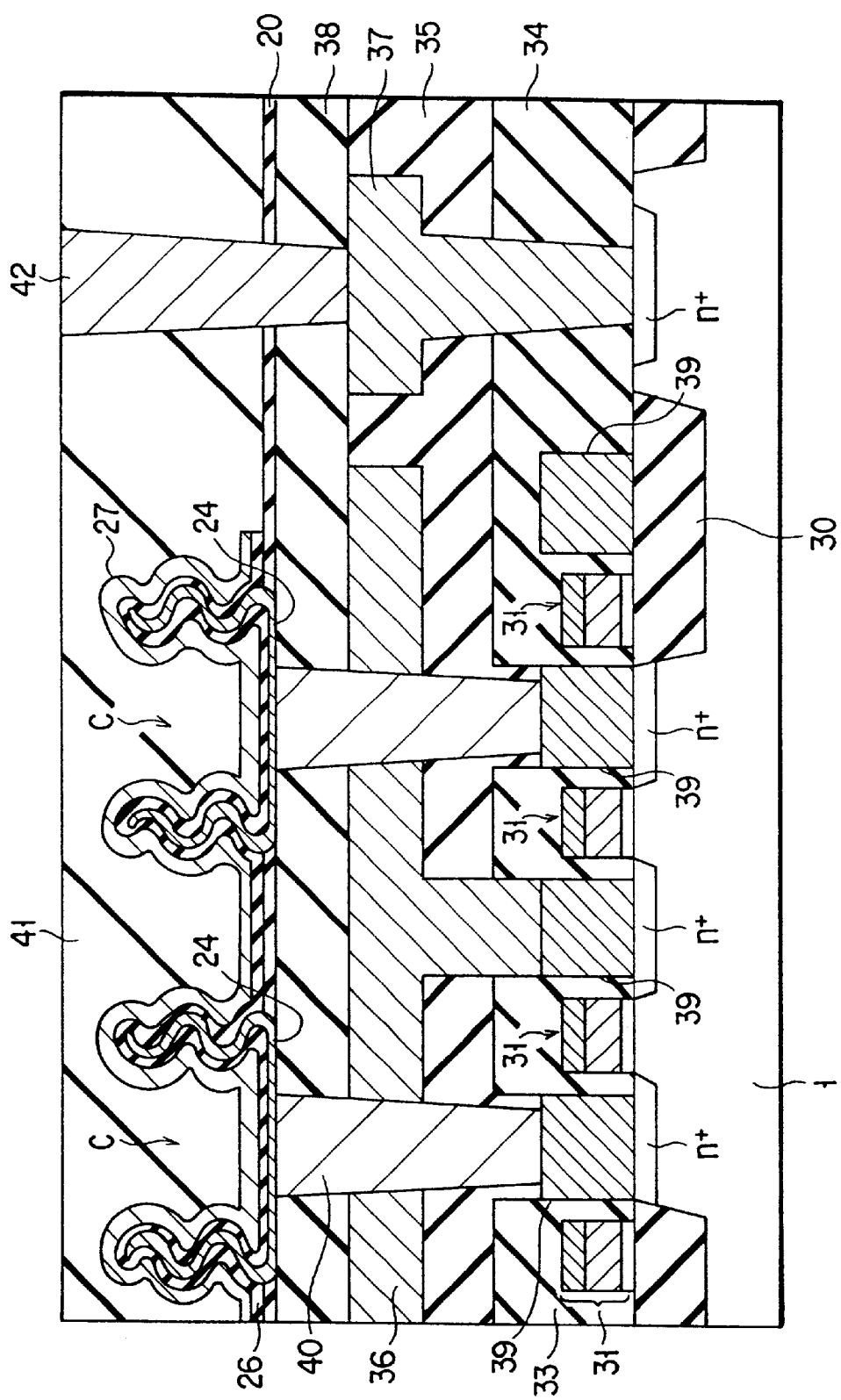
FIG. 28 is a sectional view for explaining the manufacture of a DRAM (contact plug) after formation of capacitors in the fifth embodiment.

As shown in FIG. 27, an insulating interlayer 41 formed from, e.g., silicon oxide film is deposited on the insulating interlayer 20 having the capacitors C. Subsequently, as shown in FIG. 28, the insulating interlayer 41 is planarized by, e.g., reflow and etching. Next, a contact hole is formed at a position above the interconnection layer 37 using normal lithography and etching, and a conductive film formed from a multilayered film of, e.g., titanium nitride and tungsten is deposited to form a third contact plug 42.

Figure 29:
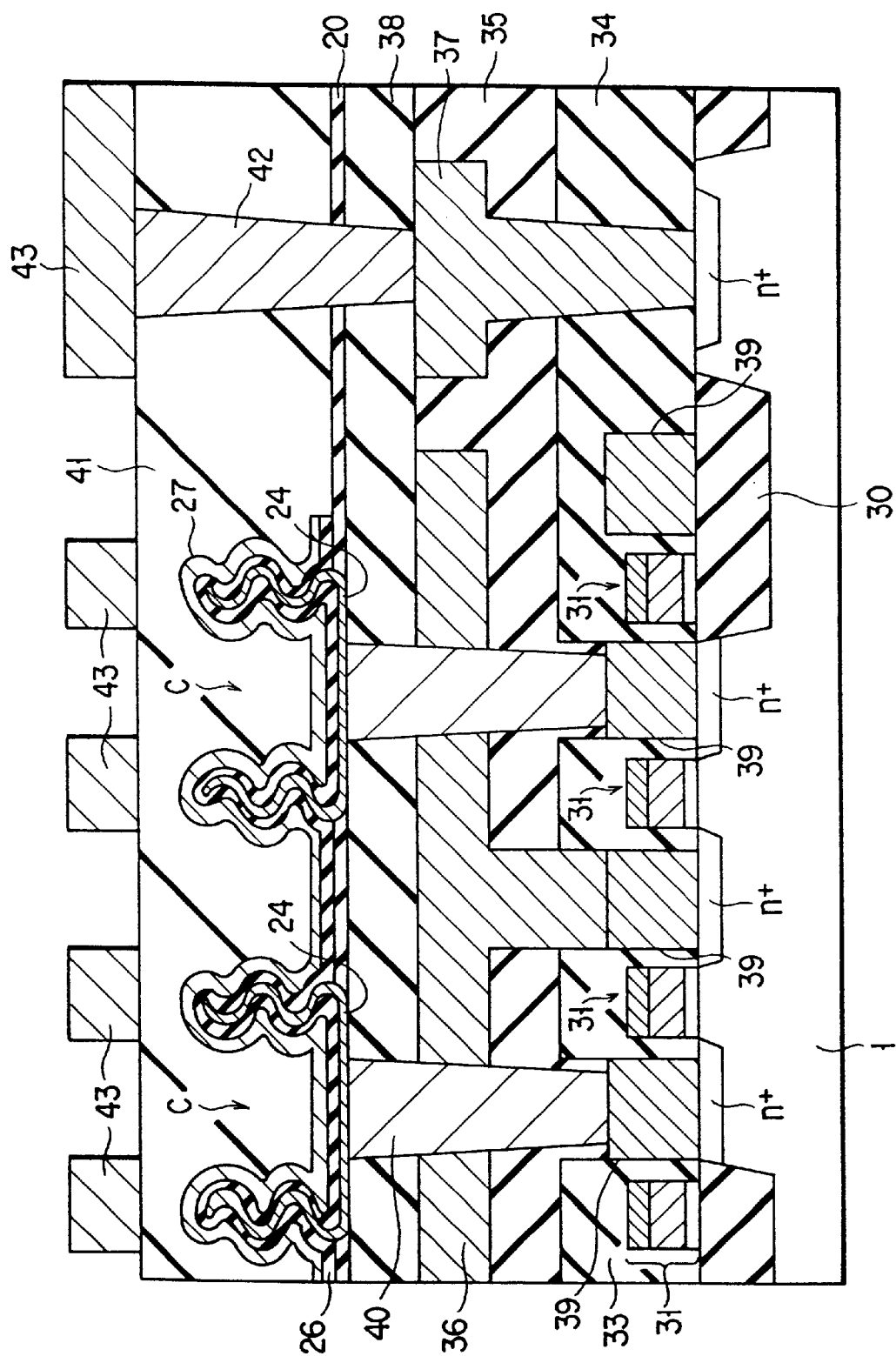
FIG. 29 is a sectional view for explaining the manufacture of a DRAM (metal interconnection layer) after formation of capacitors in the fifth embodiment.

As shown in FIG. 29, a conductive film of, e.g., aluminum (Al) is deposited on the insulating interlayer 41 having the contact plug 42 and patterned by, e.g., lithography and etching to form a metal interconnection layer 43. After this, a passivation process and the like are performed to complete a DRAM.

The fifth embodiment has the following effects. Since the thin silicon nitride film 20 prevents oxidation of the surface of the contact plug 40, a good electrical connection state can be maintained between the lower electrodes of the capacitors and the element region. Hence, a stable and high-speed DRAM operation can be realized.

When ruthenium or platinum is used as the electrode material of capacitors, a metal oxide film (high-dielectric film) of, e.g., BSTO can be used as the dielectric film of the capacitors. In addition, when a rough pattern is formed on the electrode surface of each capacitor, the electrode area of the capacitor can be increased. Hence, the capacitance can be increased.

Since the capacitance increases, the height of the crown capacitor can be suppressed, and the insulating interlayer 41 shown in FIG. 27 can be easily planarized. This facilitates the subsequent photolithography process and allows to form contact plugs 42 or metal interconnection layers 43 at a higher density. In addition, since the cell area of the DRAM can be reduced without decreasing the storage charge amount of the capacitor, a higher integration density and high-speed DRAM operation can be realized.

In the fifth embodiment, the capacitor structure of the fourth embodiment is applied to a DRAM. However, the capacitor structure of one of the first to fourth embodiments may be applied to a DRAM. In addition, the DRAM to which the capacitor structure of the present invention is applied need not always have the COB structure. The present invention can be applied to any other semiconductor device as far as it has a stacked capacitor structure.

Sixth Embodiment

The sixth embodiment of the present invention relates to a method of manufacturing a semiconductor memory device having a stacked capacitor structure of a trench type.

A capacitor of the sixth embodiment has a polysilicon film piece with a hole portion whose inner wall has concave and convex portions. The polysilicon film piece and a metal film of, e.g., ruthenium formed on the inner wall of the polysilicon film piece construct a lower electrode. A dielectric film is formed on the lower electrode. An upper electrode is formed on the dielectric film.

Figure 30:
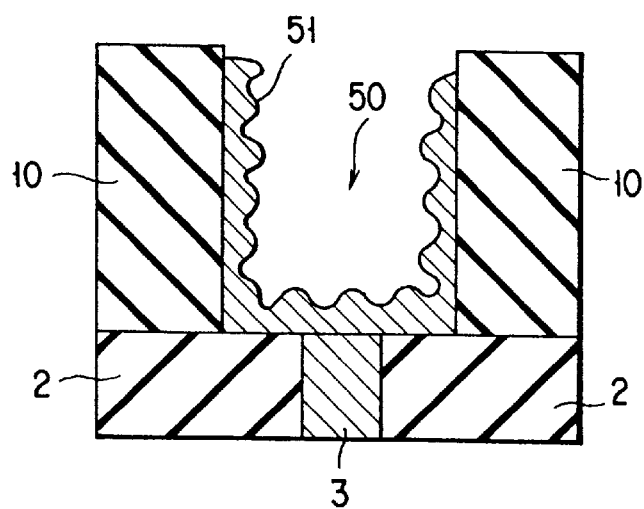
FIG. 30 is a sectional view for explaining the step until a polysilicon film as a lower electrode is formed in the sixth embodiment.

The process of manufacturing the capacitor structure will be described below. First, as shown in FIG. 30, an insulating interlayer 2 formed from, e.g., a silicon oxide film is formed on a semiconductor substrate (not shown). Holes are formed in the insulating interlayer 2, and contact plugs 3 to be connected to an element region (not shown) formed on the semiconductor substrate are formed.

An insulating interlayer 10 is stacked on the insulating interlayer 20, and hole portions 50 are formed in the insulating layer 10. The hole portions 50 are positioned above the contact plugs 3, respectively. A polysilicon film 51 is formed on the inner wall of each hole portion 50. After this, the resultant structure is annealed in vacuum (e.g., at a low pressure of $10^{-7}$ [Torr]) to obtain the polysilicon film 51 (HSG-Poly) having concave and convex portions on its surface. This polysilicon film 51 forms part of the lower electrode of a capacitor. The polysilicon film 51 is connected to the element region on the semiconductor substrate through the contact plug 3.

Figure 31:
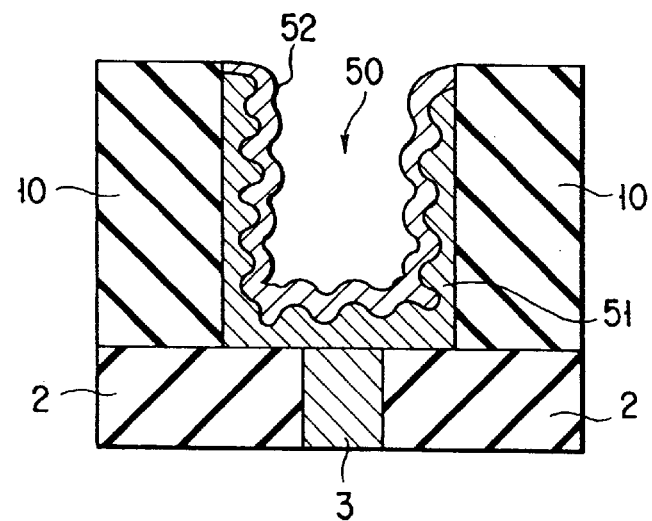
FIG. 31 is a sectional view for explaining the step of forming a conductive film as a lower electrode in the sixth embodiment.

As shown in FIG. 31, a metal film 52 (first conductive film) of, e.g., ruthenium (Ru) or platinum (Pt) is formed on the surface of the polysilicon film 51 by plating such as electroless plating. To form a ruthenium film by plating, for example, $NaBH_4$ is used as a reducer. For platinum plating, for example, $NH_2NaBH_4$ is used as a reducer. The conductive film 52 may be formed using not electroless plating but electro-deposition classified into electroplating by plating a metal oxide film of, e.g., $RuO_2$. With this process, a lower electrode having a metal film 52 with a shape on which the shape of the polysilicon film 51 is reflected is formed on the polysilicon film 51 having concave and convex portions.

Figure 32:
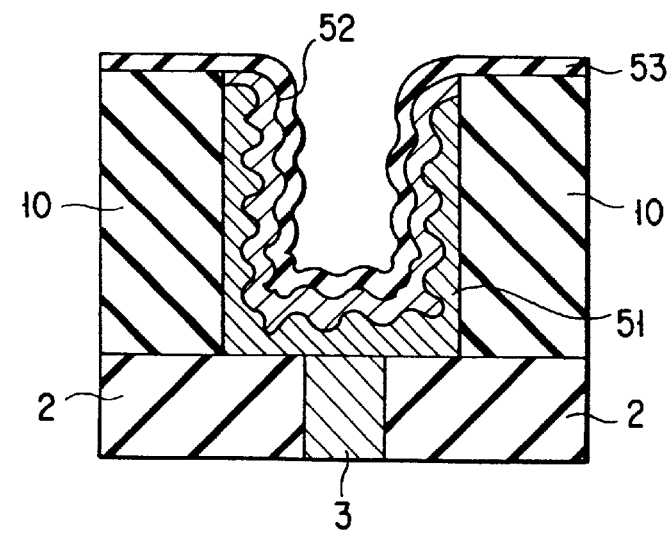
FIG. 32 is a sectional view for explaining the step of forming a dielectric film on the conductive film as a lower electrode in the sixth embodiment.
Figure 33:
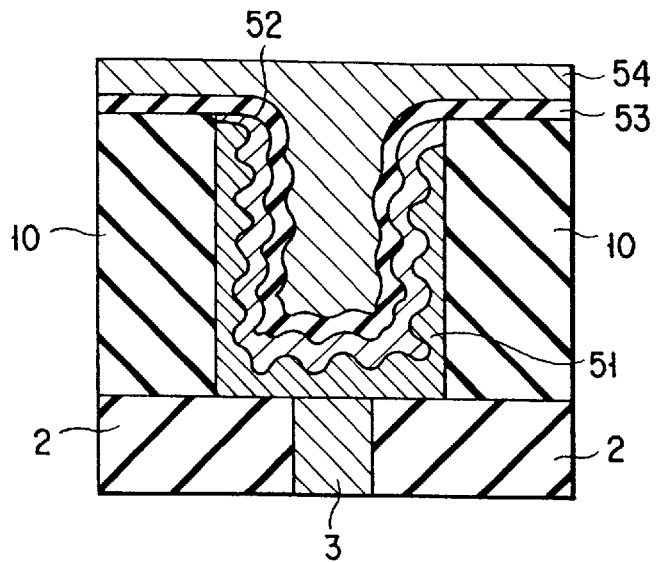
FIG. 33 is a sectional view for explaining the step of forming an upper electrode on the lower electrode via the dielectric film in the sixth embodiment.

As shown in FIG. 32, for example $(Ba,Sr)TiO_3$ as a perovskite metal oxide is deposited to form a high-dielectric film 53 (dielectric film) covering the metal film 52. As shown in FIG. 33, a metal film (second conductive film) of, e.g., ruthenium or platinum is deposited to form an upper electrode 54 covering the metal film 52 via the high-dielectric film 53. With this above process, a trench-type stacked capacitor structure having a polysilicon film 51 plated with a metal film 52 as a lower electrode and an upper electrode 54 formed on the surface of the lower electrode via a conductive film 53 is obtained.

According to the sixth embodiment, the metal film 52 of, e.g., ruthenium or platinum is formed on the surface of the polysilicon film 51 of the lower electrode by plating. When a metal oxide is used for the dielectric film of the capacitor, an oxide having conductivity is formed on the surface of the dielectric film. For this reason, even when an oxide is generated at the contact portion between the capacitor electrode and dielectric film (metal oxide), the capacitance does not decrease due to this oxide.

Figure 40:
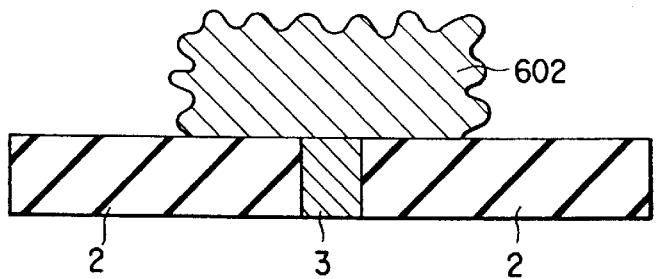
FIG. 40 is a sectional view for explaining the step of forming the lower electrode of a capacitor of a conventional semiconductor memory device using the HSG technology (after roughening process).

In the sixth embodiment, the capacitor is formed on the inner wall of the hole portion of the polysilicon film 51 having a concave portion. However, as shown in FIG. 40, the capacitor may be formed on the outer wall of the polysilicon film. The polysilicon film as a lower electrode can have any shape.

Seventh Embodiment

In the sixth embodiment mentioned above, the metal film (conductive film) 52 is directly formed on the surface of the polysilicon film 51 by plating. The seventh embodiment further has the step of forming a reaction barrier layer. The step is executed between the process of forming concave and convex portions on the surface of a polysilicon film 51 and the process of forming a metal film 52. The reaction barrier layer may be formed by plating. With this arrangement, silicidation between the polysilicon film 51 and metal film 52 is suppressed.

A method of manufacturing a semiconductor memory device according to the seventh embodiment will be described with an importance placed on its capacitor structure.

With the same process as in the sixth embodiment, an insulating interlayer 2, contact plugs 3, an insulating layer 10, and polysilicon film 51 are sequentially formed on a semiconductor substrate.

Figure 34:
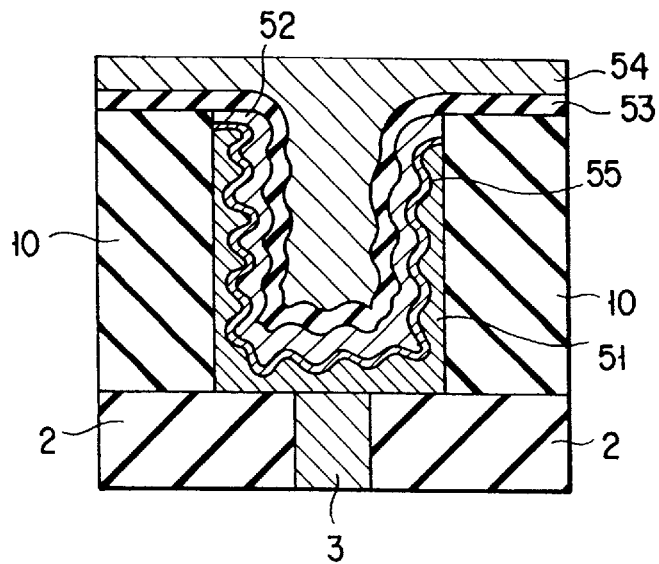
FIG. 34 is a sectional view showing a capacitor structure having a reaction barrier layer in the seventh embodiment.

As shown in FIG. 34, a reaction barrier layer 55 formed from, e.g., a very thin SiN film is formed on the surface of the polysilicon film 51 by, e.g., RTN or plasma nitriding. After this, as in the sixth embodiment, the metal film 52 is formed by plating, and a high-dielectric film 53 and an upper electrode 54 are sequentially formed.

The reaction barrier layer 55 acts to suppress silicidation between the polysilicon film 51 and metal film 52. Although the SiN film used as the reaction barrier layer 55 is an insulating film, a tunnel current flows in the presence of a small electric field because the film is very thin. For this reason, the metal film 52 can be formed on the reaction barrier layer 55 by electroplating. A parasitic capacitor comprising the polysilicon film 51, reaction barrier layer 55, and metal film 52 is connected in series with the regular capacitor comprising the metal film 52, high-dielectric film 53, and metal film 54. In fact, the parasitic capacitor does not significantly lower the capacitance because the reaction barrier layer 55 is very thin.

The reaction barrier layer 55 may be formed by depositing Ti on the polysilicon film 51 by, e.g., CVD and nitriding the Ti film. Alternatively, a TiN film or a multilayered film of Ti/TiN may be formed by, e.g., CVD. Or, the reaction barrier layer may be formed by plating. In this case, however, the reaction barrier layer formed outside the region of the polysilicon film 51 (HSG-Poly) must be removed.

Eighth Embodiment

In association with a semiconductor memory device according to the eighth embodiment of the present invention, there is provided a method of manufacturing a DRAM having a COB (Capacitor Over Bit-line) structure to which the stacked capacitor structure of the sixth embodiment is applied. The eighth embodiment will be described down below.

Figure 35:
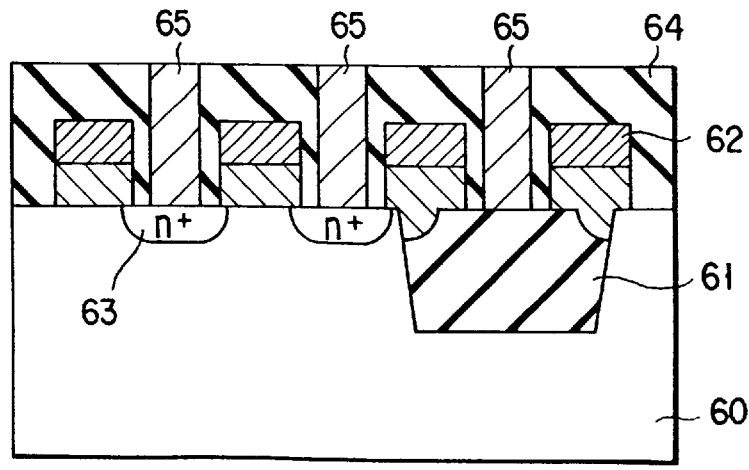
FIG. 35 is a sectional view for explaining the manufacturing process of a DRAM (MOS transistor) in the eighth embodiment.

First, as shown in FIG. 35 (sectional view at the connection position between a transistor and a capacitor), a transistor having gate electrodes 62 and source/drain regions 63 are formed on a semiconductor substrate 60. More specifically, an STI element isolation film 61 is formed in the semiconductor substrate 60, and the gate electrodes 62 as word lines are formed via a gate oxide film. Subsequently, the source/drain regions 63 are formed in self-alignment with the gate electrodes 62. The gate electrodes 62 are covered with an insulating film 64. Using a technology (Self-aligned poly Plug technology) disclosed in Y. Kohyama et al., "A Fully Printable Self-aligned and Planarized Stacked Capacitor DRAM Cell Technology for 1 Gbit DRAM and Beyond", 97 VLSI Symp. Tech., pp. 17–18, 1997, poly plugs 65 extending through the insulating film 64 and connected to the source/drain regions 63 of the transistor are formed.

Figure 36:
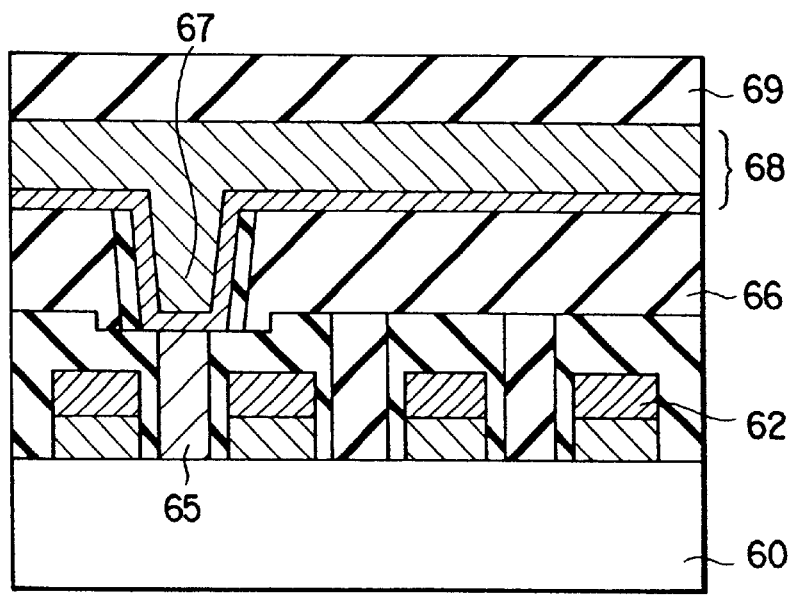
FIG. 36 is a sectional view for explaining the manufacturing process of a DRAM (bit line) in the eighth embodiment.

An interconnection layer as bit lines is formed on the semiconductor substrate having the transistor via an insulating interlayer. More specifically, as shown in FIG. 36 (sectional view at the connection position between the transistor and the bit line), an insulating interlayer 66 is formed on the semiconductor substrate having the transistor and poly plugs 65. Contact holes 67 for bit lines are formed at positions above the poly plugs 65. Then, a bit line 68 is formed using, e.g., a damascene method. The bit line 68 may have a multilayered structure of titanium nitride and tungsten. The bit line 68 is connected to one of the source/drain regions of the transistor formed on the semiconductor substrate via the poly plug 65. A cap SiN film 69 is formed on the insulating interlayer 66 having the bit line 68.

Figure 37:
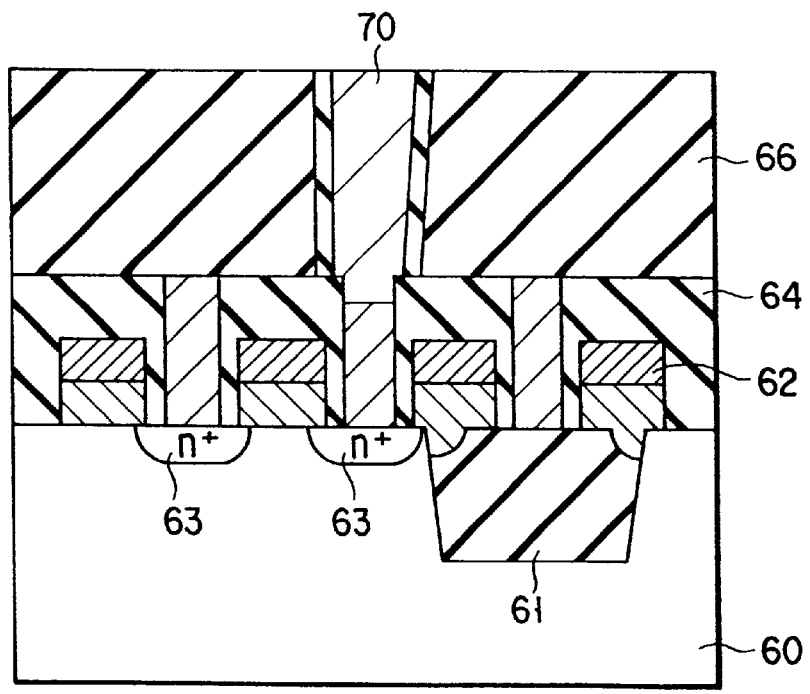
FIG. 37 is a sectional view for explaining the manufacturing process of a DRAM (contact plug) in the eight embodiment.

Subsequently, as shown in FIG. 37 (sectional view taken along a direction perpendicular to the bit line at the connection position between the transistor and capacitor), a contact plug 70 extending through the cap SiN film 69 and insulating interlayer 66 and connected to the source/drain region 63 is formed. The contact plug 70 is formed using, e.g., a "Cross Point Contact Technology" descried in the above reference.

Figure 38:
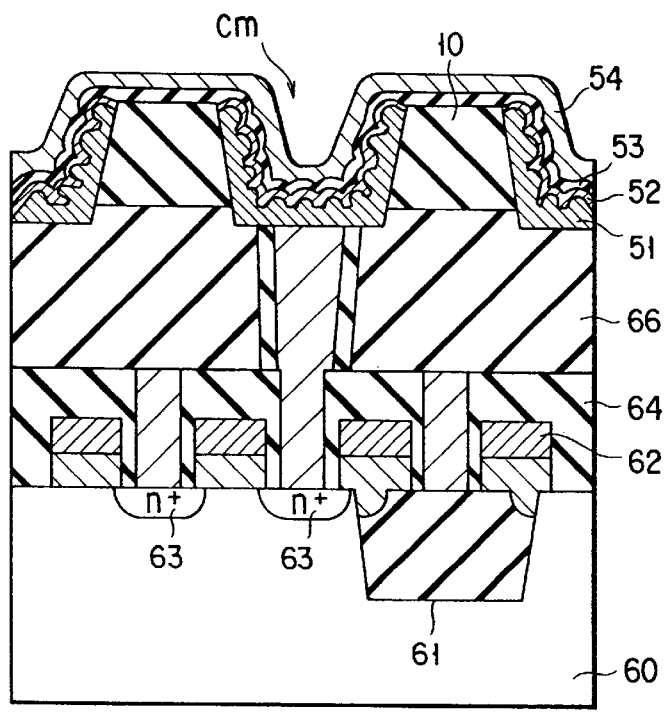
FIG. 38 is a sectional view for explaining the manufacturing process of a DRAM (capacitor) in the eight embodiment.
Figure 39:
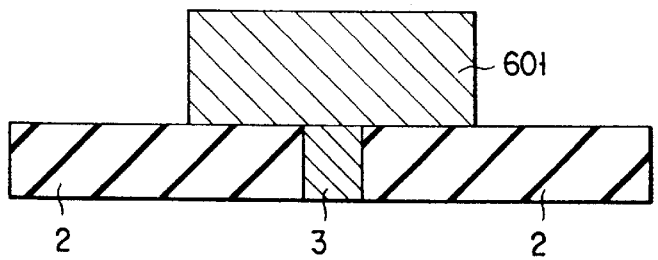
FIG. 39 is a sectional view for explaining the step of forming the lower electrode of a capacitor of a conventional semiconductor memory device using the HSG technology (before roughening process)

With the same process as in the sixth embodiment shown in FIGS. 30 to 33, a stacked capacitor Cm comprising a polysilicon film 51 (lower electrode) with a surface plated with a metal film 52, a high-dielectric film 53, and a metal film 54 (upper electrode) is formed on the insulating interlayer 66, as shown in FIG. 38. After this, processes of forming a metal interconnection layer and the like are performed to complete a DRAM.

In the above-described embodiments, BSTO is used for the dielectric film of the capacitor. However, a film of other suitable materials may be used as the dielectric film in any of the above embodiments. For example, a metal oxide film of $BaTiO_3$, $SrTiO_3$, $PbZrO_3$, $LiNbO_3$, $Bi_4Ti_3O_{12}$, or $Ta_2O_5$ may be used. Further, an alkaline earth metal or a rare earth metal may be used as a material of the dielectric film, in combination with the above metal oxides. The dielectric film may be made of not only a high-dielectric material, but also a ferroelectric material or a dielectric material. As the electrode material of the capacitor, ruthenium and platinum have been exemplified. However, other metal materials, or an alloy or oxide thereof may be used. For example, Re, Os, Rh, Ir, or Sr, an oxide thereof, an alloy thereof, an oxide of the alloy, or W, Nb, Al, Ti, Ta, Mo, Cu, WN, TaN, Pd, Fe, Mn, Cr, Co, or Ni can be used as the electrode material. The application of the present invention is not limited to a capacitor for data storage. The present invention can also be applied to a capacitor with another application purpose such as signal delay or charge pump, and also can be applied to any semiconductor devices having a stacked capacitor structure.

As has been described above, according to the present invention, since the electrode of the capacitor has a rough or undulated surface, the electrode area of the capacitor can be increased. The inner and outer surfaces of the lower electrode of the capacitor can be made rough such that the convex portions on the outer surface correspond to the concave portions on the inner surface. For this reason, the conductive film as the lower electrode can be made thinner than that formed by the conventional roughening technique. Hence, the area of the memory cell can be reduced, and the degree of integration can be increased.

In addition, since the conductive film as the lower electrode of the capacitor is formed using a silicon semiconductor film block having a rough or undulated surface as a "mould", the present invention can roughen a metal electrode. With this arrangement, as the dielectric film of the capacitor, a metal oxide such as BSTO or another high-dielectric or ferroelectric film can be used.

Furthermore, since the capacitor electrode can be formed by plating, i.e., a more popular method than the prior art, the manufacturing process can be simplified.

Therefore, according to the present invention, a semiconductor memory device having a high density and a data storage capacitor improved with a reduced cell area can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a capacitor in a semiconductor device, comprising:
    forming a dummy film having an undulated surface;
    depositing a conductive material film containing at least one metal element on the dummy film so as to directly transfer to the conductive material film a shape of the undulated surface of the dummy film;
    leaving said dummy film from said conductive material film to form a lower electrode;
    forming a dielectric material film to cover inner and outer surfaces of the lower electrode; and
    forming an upper electrode on at least one surface of the dielectric material film to face the lower electrode through the dielectric material film.

2. The method according to claim 1, further comprising:
    oxidizing said dummy film after forming said dummy film; and
    removing the oxidized dummy film.

3. The method according to claim 1, wherein said dielectric material film is made of a metal oxide.

4. The method according to claim 1, wherein said dummy film is a silicon semiconductor film.

5. The method according to claim 4, wherein said undulated surface of said dummy film is made by forming hemispherical grains on said dummy film.

6. The method according to claim 5, wherein said hemispherical grains are formed by annealing said dummy film in a non-oxidizing atmosphere.

7. The method according to claim 1, wherein said metal element is ruthenium (Ru).

8. The method according to claim 1, wherein said dummy film is formed only once during the formation of the lower and upper electrodes.

9. A method for forming a capacitor in a semiconductor device, comprising:
    forming an insulating layer and forming a hole in the insulating layer;
    forming a dummy film having an undulated surface so as to cover an inner surface of the hole;
    forming a conductive material film containing at least one metal element on the undulated surface of the dummy film so as to directly transfer to the conductive material film a shape of the undulated surface of the dummy film;
    leaving said dummy film from said conductive material film to form a lower electrode;

forming a dielectric material film so as to cover the undulated surface of the lower electrode; and forming an upper electrode on the dielectric material film so as to face the lower electrode through the dielectric material film.

10. The method according to claim 9, further comprising:

removing said dummy film after forming said conductive material film.

11. The method according to claim 9, wherein said dielectric material film is made of a metal oxide.

12. The method according to claim 9, wherein said film is a silicon semiconductor film.

13. The method according to claim 12, wherein said undulated surface of said dummy film is provided by forming hemispherical grains on said dummy film after forming said dummy film.

14. The method according to claim 13, wherein said hemispherical gains are formed by annealing said dummy film in a non-oxidizing atmosphere.

15. The method according to claim 9, wherein said metal element is ruthenium (Ru).

16. The method according to claim 9, wherein said dummy film is forming only once during the formation of the lower and upper electrodes.

17. A method for forming a capacitor in a semiconductor device, comprising:

forming a dummy film having an undulated surface;

forming a lower electrode by forming a conductive material film containing at least one metal element on the undulated surface of said dummy film so as to directly transfer to the lower electrode a shape of the undulated surface;

forming a dielectric material film so as to cover one surface of said conductive material film; and forming an upper electrode on the dielectric material film so as to face the lower electrode through the dielectric material film.

18. The method according to claim 17, wherein said dielectric film and said upper electrode are formed so as to conform to said undulated surface of said conductive material film.

19. The method according to claim 17, wherein each of said conductive material film and said dielectric material film has a substantially uniform thickness at any portions.

20. The method according to claim 17, further comprising:

forming a first insulating layer before forming said dummy film, and forming a hole portion in the first insulating layer;

oxidizing said dummy film after forming said dummy film having said undulated surface;

removing the first insulating layer and the oxidized portion of said film after forming said lower electrode.

21. The method according to claim 20, further comprising forming a second insulating layer on a semiconductor substrate before forming said first insulating layer.

22. The method according to claim 17, wherein said dielectric material film is made of a metal oxide.

23. The method according to claim 17, wherein said dummy film is a silicon semiconductor film.

24. The method according to claim 23, wherein said undulated surface of said dummy film is provided by forming hemispherical grains on said dummy film.

25. The method according to claim 24, wherein said hemispherical grains are formed by annealing said dummy film in a non-oxidizing atmosphere.

26. The method according to claim 17, wherein said conductive material film is formed by plating.

27. The method according to claim 26, wherein said conductive material film is formed by electroplating a metal on said undulated surface of said dummy film by use of electroless plating.

28. The method according to claim 26, wherein said test conductive material film is formed by electroplating a metal oxide on said undulated surface of said dummy film by use of electrolytic deposition.

29. The method according to claim 17, further comprising:

forming a reaction barrier layer on said dummy film for suppressing a chemical reaction between said dummy film and said conductive material film, before forming said conductive material film and after said dummy film is formed.

30. The method according to claim 29, wherein the reaction barrier layer is made by plating.

31. The method according to claim 29, wherein said reaction barrier layer comprises at least one of TiN layer and Ti layer.

32. The method according to claim 29, wherein said reaction barrier layer is formed by nitriding said undulated surface of said film.

33. The method according to claim 17, wherein said metal element is ruthenium (Ru).

34. The method according to claim 17, wherein said dummy film is formed only once during the formation of the lower and upper electrodes.

35. A method for forming a capacitor in a semiconductor device, comprising:

forming a dummy film having an undulated surface;

forming a lower electrode by forming a conductive material film on the undulated surface of said dummy film so as to transfer to the lower electrode a shape of the undulated surface;

forming a dielectric material film so as to cover one surface of said conductive material film;

forming an upper electrode on the dielectric material film so as to face the lower electrode through the dielectric material film; and forming a reaction barrier layer on said dummy film for suppressing a chemical reaction between said dummy film and said conductive material film, before forming said conductive material film and after said dummy film is formed.

36. The method according to claim 35, wherein the reaction barrier layer is made by plating.

37. The method according to claim 35, wherein said reaction barrier layer comprises at least one of TiN layer and Ti layer.

38. The method according to claim 35, wherein said reaction barrier layer is formed by nitriding said undulated surface of said dummy film.

* * * * *

UNITED STATES PATENT AND TRADEMARK OFFICE
CERTIFICATE OF CORRECTION

PATENT NO.    : 6,403,444 B2
DATED         : June 11, 2002
INVENTOR(S)   : Yoshiaki Fukuzumi et al.

It is certified that error appears in the above-identified patent and that said Letters Patent is hereby corrected as shown below:

Column 19,
Line 23, "forming" has been replaced with -- formed --.

Signed and Sealed this

Twenty-fifth Day of February, 2003

JAMES E. ROGAN
*Director of the United States Patent and Trademark Office*